(12) United States Patent
Tsutsumi et al.

(10) Patent No.: US 6,359,368 B1
(45) Date of Patent: Mar. 19, 2002

(54) SURFACE ACOUSTIC WAVE REFLECTOR

(75) Inventors: Jun Tsutsumi; Takashi Matsuda; Osamu Ikata; Yoshio Satoh, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/628,276

(22) Filed: Jul. 28, 2000

(30) Foreign Application Priority Data

Sep. 20, 1999 (JP) .............................. 11-265651

(51) Int. Cl.[7] .............................................. H01L 41/08
(52) U.S. Cl. ..................... 310/313 D; 333/194; 333/195
(58) Field of Search ...................... 310/313 R, 313 D; 333/150, 151, 153, 193, 195

(56) References Cited

U.S. PATENT DOCUMENTS

| | | | | |
|---|---|---|---|---|
| 4,484,160 A | * | 11/1984 | Riha | 333/195 |
| 5,051,644 A | * | 9/1991 | Wright | 310/313 D |
| 5,061,871 A | * | 10/1991 | Wright | 310/313 D |
| 5,270,606 A | | 12/1993 | Cho et al. | |
| 5,379,010 A | | 1/1995 | Ruile et al. | |
| 5,760,664 A | * | 6/1998 | Allen | 333/194 |
| 6,140,890 A | * | 10/2000 | Sakairi | 333/195 |

* cited by examiner

*Primary Examiner*—Mark O. Budd
(74) *Attorney, Agent, or Firm*—Armstrong, Westerman, Hattori, McLeland & Naughton, LLP

(57) ABSTRACT

A surface acoustic wave reflector includes a piezoelectric substrate and a plurality of perturbation members arranged at a first period on the piezoelectric substrate. A plurality of free-surface regions where no perturbation members exist are formed in an arrangement of the perturbation members.

19 Claims, 24 Drawing Sheets

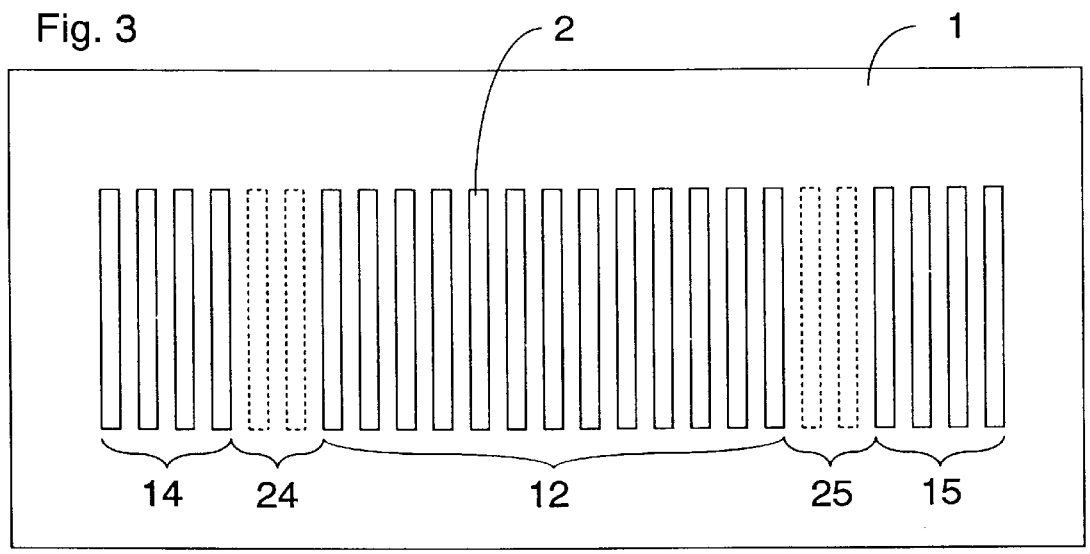
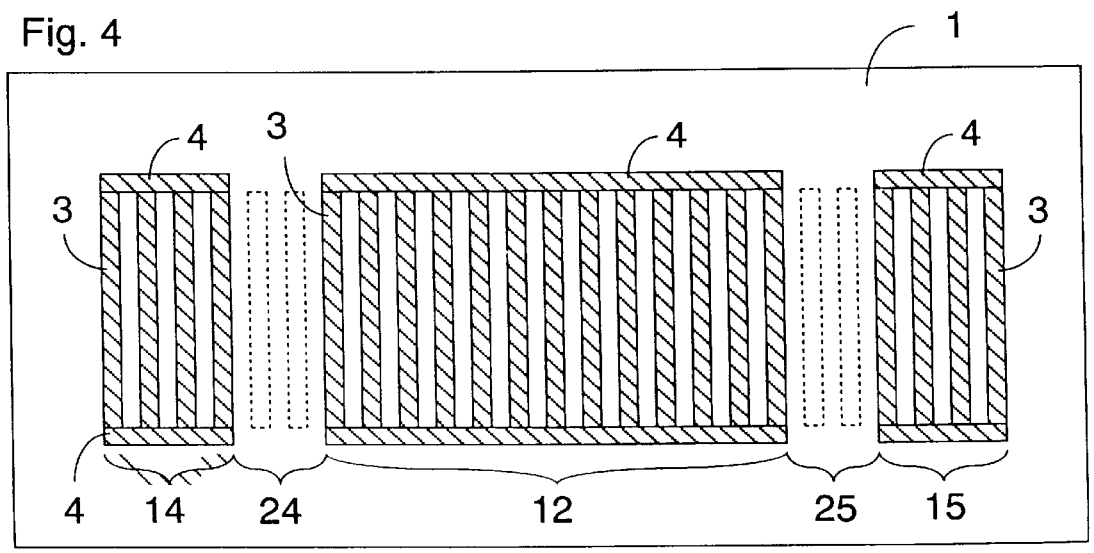

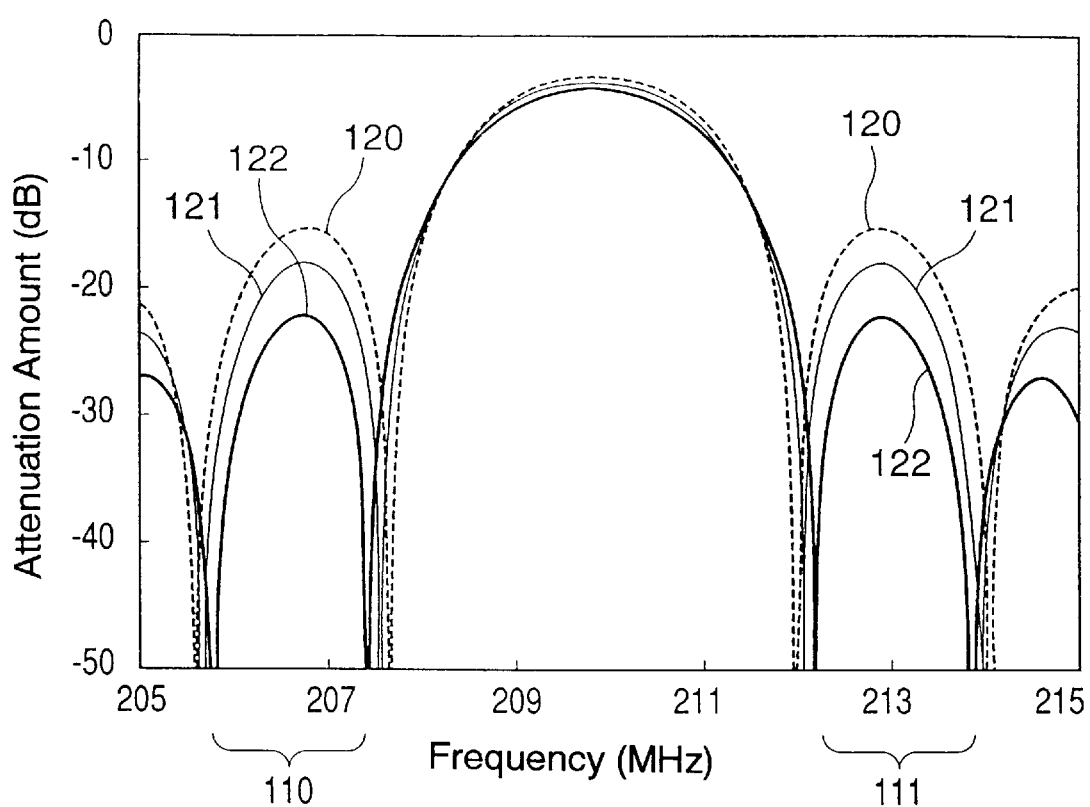

| Total number of withdrawn perturbation members | Numbers of withdrawal positions counted from the left | |
|---|---|---|
| 4 | 14,15 | 86,87 |
| 6 | 14,15,16 | 85,86,87 |
| 10 | 12,13,14,15,16 | 85,86,87,88,89 |
| 12 | 12,13,14,15,16,17 | 84,85,86,87,88,89 |

| Total number of withdrawn perturbation members | Numbers of perturbation members existing on substrate | | |
|---|---|---|---|
| | Left-end Group | Central Group | Right-end Group |
| 4 | 13 | 70 | 13 |
| 6 | 13 | 68 | 13 |
| 10 | 11 | 70 | 11 |
| 12 | 11 | 66 | 11 |

Fig. 10 (a) Two free-surface (regions 24, 25)
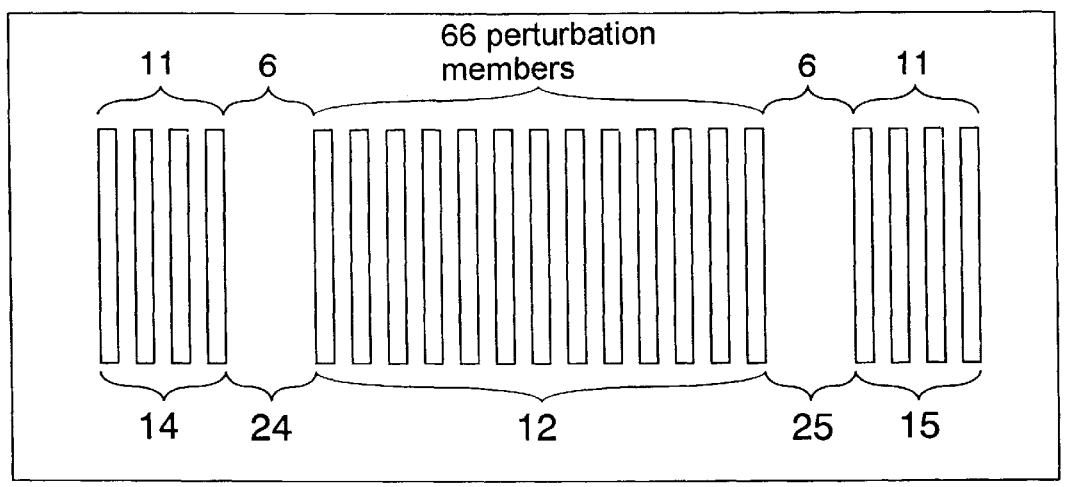
Fig. 10 (b) Four free-surface (regions 24, 25, 26, 27)
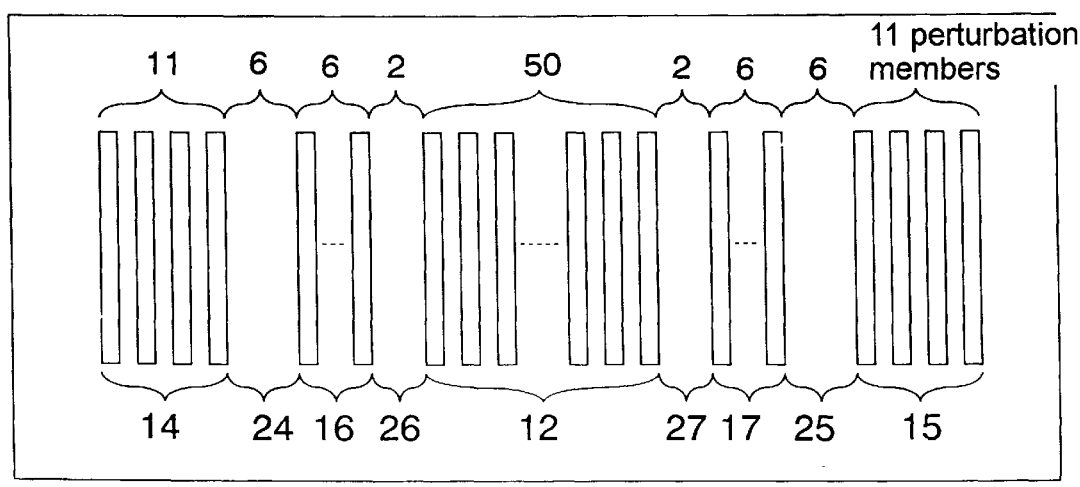

Fig. 12 (a)  Two symmetric free-surface (regions 24, 25)
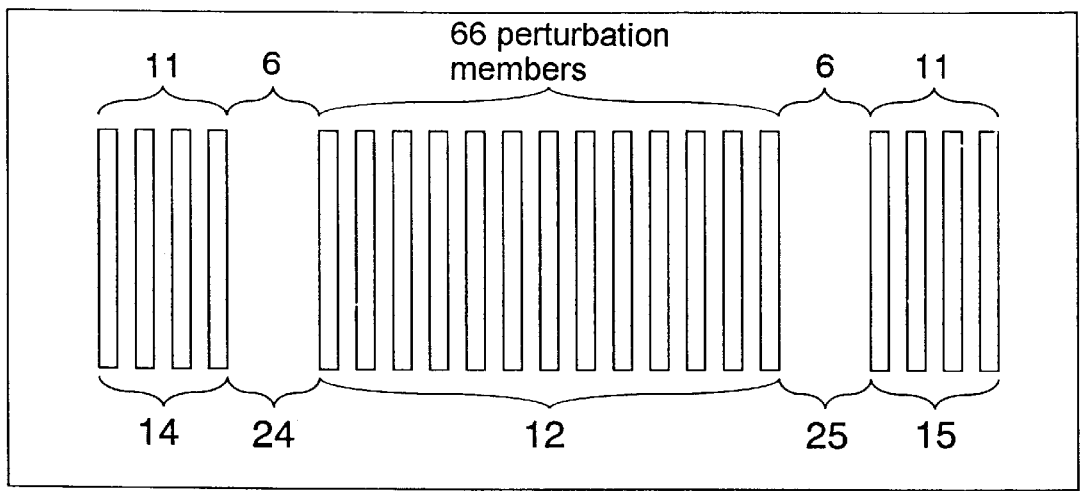
Fig. 12(b)  Two asymmetric free-surface (regions 24, 25)
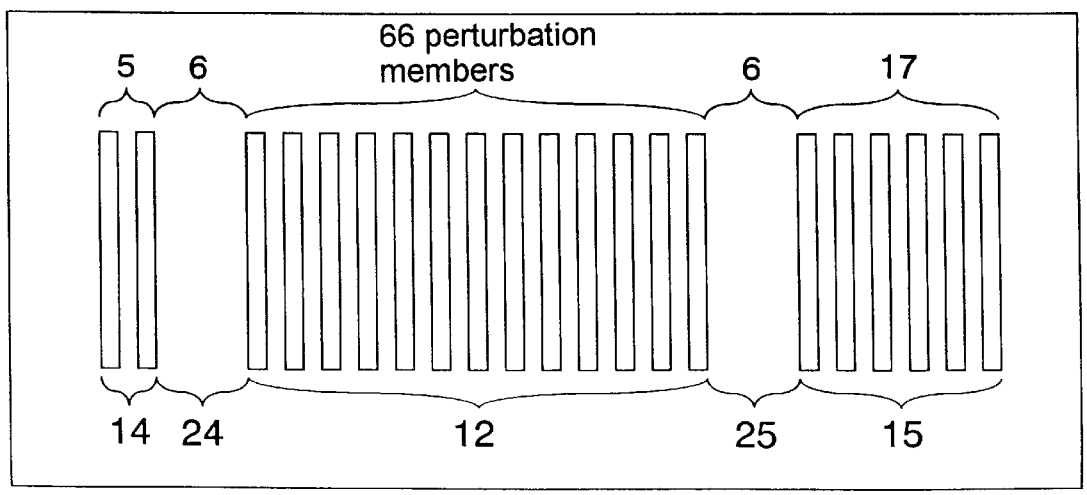

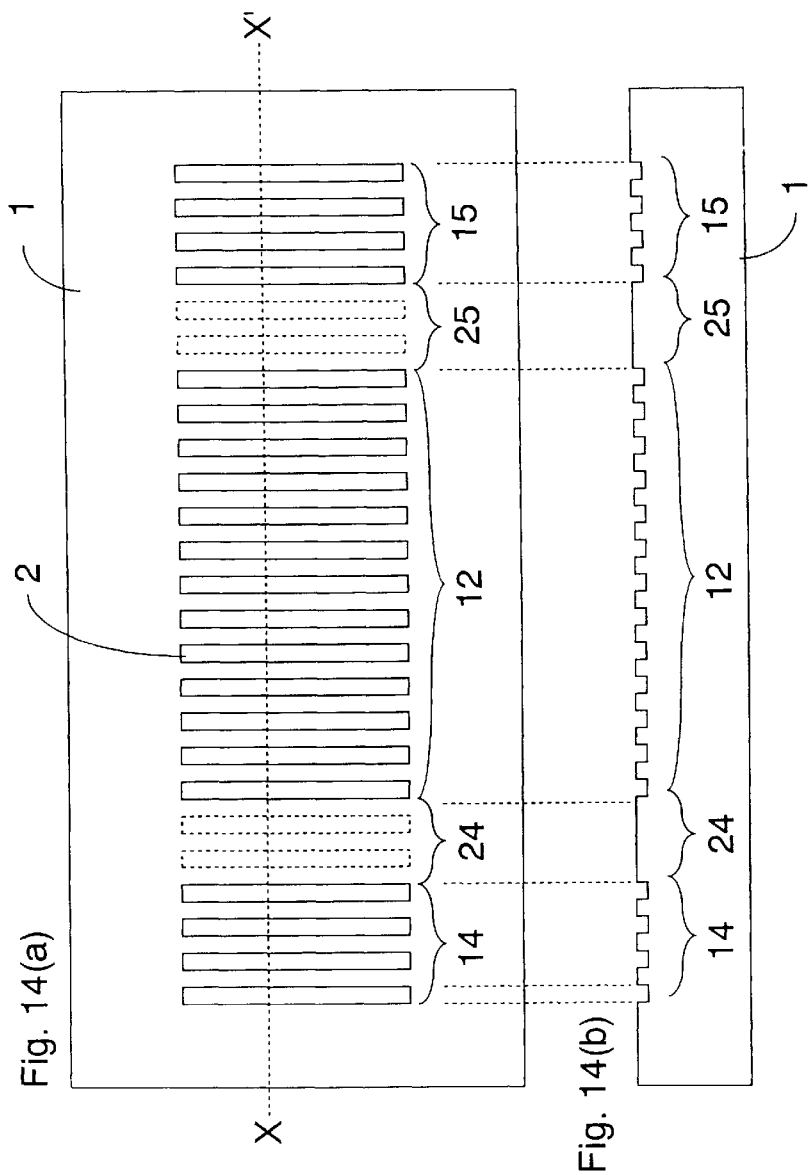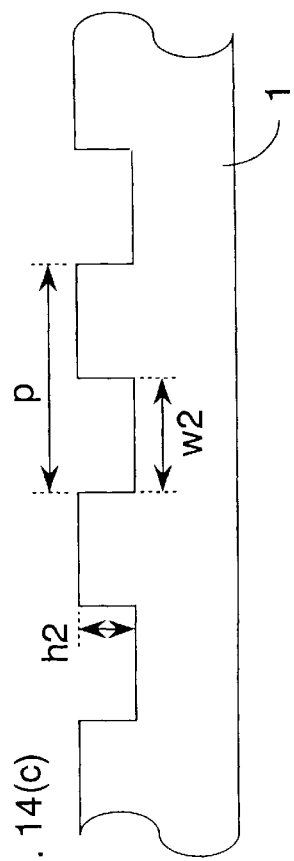
Fig. 14(a)
Fig. 14(b)
Fig. 14(c)

US 6,359,368 B1

SURFACE ACOUSTIC WAVE REFLECTOR

CROSS-REFERENCE TO RELATED APPLICATION

This application is related to Japanese Patent Application No. HEI 11(1999)-265651 filed on Sep. 20, 1999, whose priority is claimed under 35 USC § 119, the disclosure of which is incorporated by reference in its entirety.

BACKGROUND OF THE INVENTION

1. Field of the Invention

The present invention relates to a surface acoustic wave reflector, particularly to a surface acoustic wave reflector usable in a surface acoustic wave filter.

2. Description of Related Art

Surface acoustic wave filters have been used as filters in mobile communication terminals typified by portable telephones. With development of mobile communication systems, much higher quality is demanded of surface acoustic wave filters. A CDMA (code division multiple access) system, which has been increasingly introduced recently, requires IF (intermediate frequency) filters having extremely tough characteristic such as wider band, lower shape factor and better phase linearity than required by a conventional TDMA (time division multiple access) system.

To produce a small-sized filter which satisfies these strict demands, there is proposed a surface acoustic filter using a surface acoustic reflector having perturbation members arranged periodically (for example, metal electrode fingers of a grating structure) (see U.S. Pat. No. 5,379,010).

Such a surface acoustic wave filter is composed of a combination of a so-called interdigital transducer (referred to as IDT hereinafter) for input and output and a surface acoustic wave reflector (referred to simply as a reflector hereinafter). The frequency characteristic of the surface acoustic filter is a resultant of addition of the frequency characteristics of the IDT and the reflector.

For obtaining a desired frequency characteristic, it is necessary to control the frequency characteristic of the reflector. For this purpose, conventionally, the perturbation members are weighted by withdrawal (i.e., selective withdrawal of perturbation members), or if the perturbation members are made of metal strips, they are weighted by varying their widths one by one (see U.S. Pat. No. 5,270,606).

However, weighting simply by thinning has a limit because this provides only a binary weighting according to the presence or absence of perturbation members. In weighting by varying the widths of metal strips one by one, manufacturing variations in the widths of the metal strips result in a distortion from a desired frequency characteristic, and consequently the production yield drops.

To sum up, it is difficult to obtain desired filter characteristic by the conventional ways of weighting the reflector.

SUMMARY OF THE INVENTION

An object of the present invention is to provide a surface acoustic wave reflector so constructed that, in the frequency characteristic required of the surface acoustic wave filter, a first sidelobe can be suppressed.

The present invention provides a surface acoustic wave reflector comprising a piezoelectric substrate and a plurality of perturbation members arranged at a first period on the piezoelectric substrate, wherein a plurality of free-surface regions where no perturbation members exist are formed in an arrangement of the perturbation members.

With this construction, the first sidelobe in the frequency characteristic of the reflector can be suppressed more effectively.

BRIEF DESCRIPTION OF THE DRAWINGS

FIG. 3 is a schematic view illustrating the construction of a reflector in accordance with Example 1 of the present invention (in which the numbers of perturbation members in both end regions are the same);

FIG. 4 is a schematic view illustrating the construction of a reflector in accordance with Example 1 of the present invention (in which the perturbation members are electrically short-circuited);

FIG. 5 is a graph for comparison of the frequency characteristics of a reflector from which no perturbation members are withdrawn and reflectors from which some perturbation members are withdrawn;

FIGS. 10(a) and 10(b) are schematic views illustrating the construction of reflectors in accordance with Example 3 of the present invention;

FIGS. 12(a) and 12(b) are schematic views illustrating the construction of reflectors in accordance with Example 4 of the present invention;

FIGS. 14(a), 14(b) and 14(c) are schematic views illustrating the construction of a reflector in accordance with Example 5 of the present invention in which the perturbation members are formed of grooves;

DESCRIPTION OF THE PREFERRED EMBODIMENTS

Figure 1A:
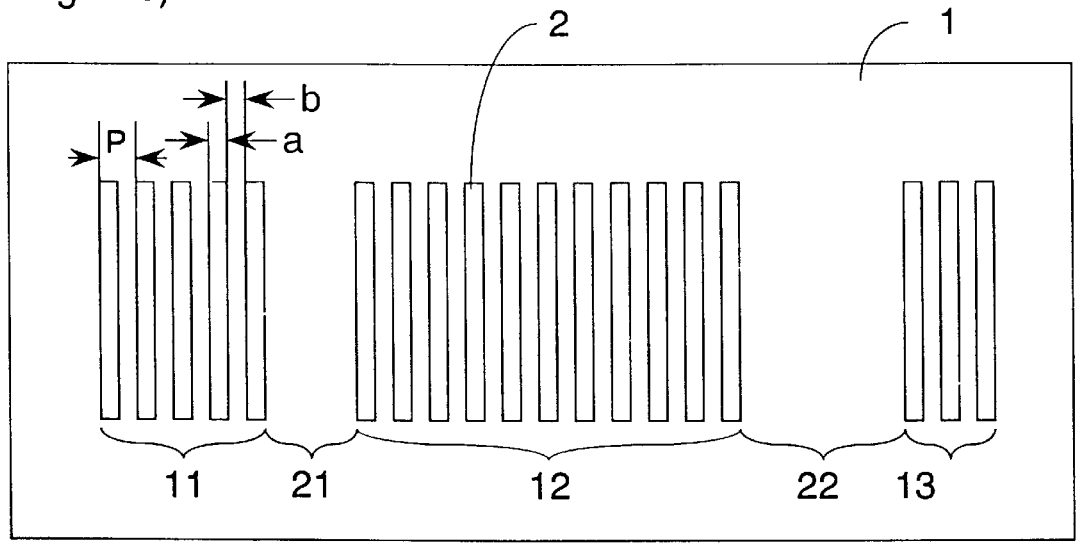
FIGS. 1(a) and 1(b) are schematic views illustrating the construction of reflectors in accordance with Example 1 of the present invention.

The perturbation member gives some disturbance to a surface acoustic wave propagating on the piezoelectric substrate and may be formed of a metal strip, for example. It suffices that the free-surface region without perturbation members have a width corresponding to the width of perturbation members adjacently arranged for a plurality of periods.

In the present invention, in the case where the number of the free-surface regions is an even number and a zone where the perturbation members exist is separated into an odd number of regions in a direction of propagation of a surface acoustic wave by the free-surface regions, the number of perturbation members in the central region of said odd number of regions may be larger than the number of perturbation members in other regions.

Further, the numbers of perturbation members in the regions other than the central region among said odd number of regions may be symmetric with respect to the central region.

The present invention also provides a surface acoustic wave reflector, wherein, in the case where the number of the free-surface regions is two and the zone where the perturbation members exist is separated into three regions in the surface acoustic wave propagation direction by the free-surface regions, the number of perturbation members in the central region of said three regions is larger than the numbers of perturbation members in other regions.

Further, the numbers of perturbation members in other regions at both ends of said three regions than the central region may be the same.

For effectively suppressing the first sidelobe of the frequency characteristic of the reflector, it is preferable that the centers of said two free-surface regions are located at a position of 8 to 24% and at a position of 77 to 93% from the left with respect to where the whole perturbation members of the surface acoustic wave reflector exist.

The present invention also provides a surface acoustic wave reflector, wherein perturbation members are disposed in the free-surface regions so that the velocity of a surface acoustic wave propagating in the free-surface regions approaches the velocity of a surface acoustic wave propagating in the regions where the perturbation members exist.

The present invention further provides a surface acoustic wave reflector, wherein a plurality of perturbation members are disposed in the free-surface regions at a second period different from the first period.

Here, it is preferable that the second period is shorter than the first period. With this construction, the difference between the velocity of the surface acoustic wave in the free-surface region and that in the region where the perturbation members exist can be reduced without deterioration in characteristics owing to emission of a bulk wave.

Also, from the viewpoint of manufacture, it is preferable that the perturbation members in the regions where the perturbation members exist and the perturbation members in the free-surface regions are all formed of the same material.

Further, the perturbation members may be formed of electrically short-circuited metal strips or electrically opened metal strips.

As the metal strips here, thin metal films are arranged at intervals. The perturbation members may be formed of a metal such as Al, Cu, Au, Ti or Mg, an alloy of two or more of these metals, or a multi-layered film of two or more of these metals.

Further the perturbation members may be formed of grooves periodically arranged on the surface of the piezoelectric substrate.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. The present invention is now described in detail by way of examples as shown in the drawings. The present invention, however, is not limited to these examples.

Figure 24:
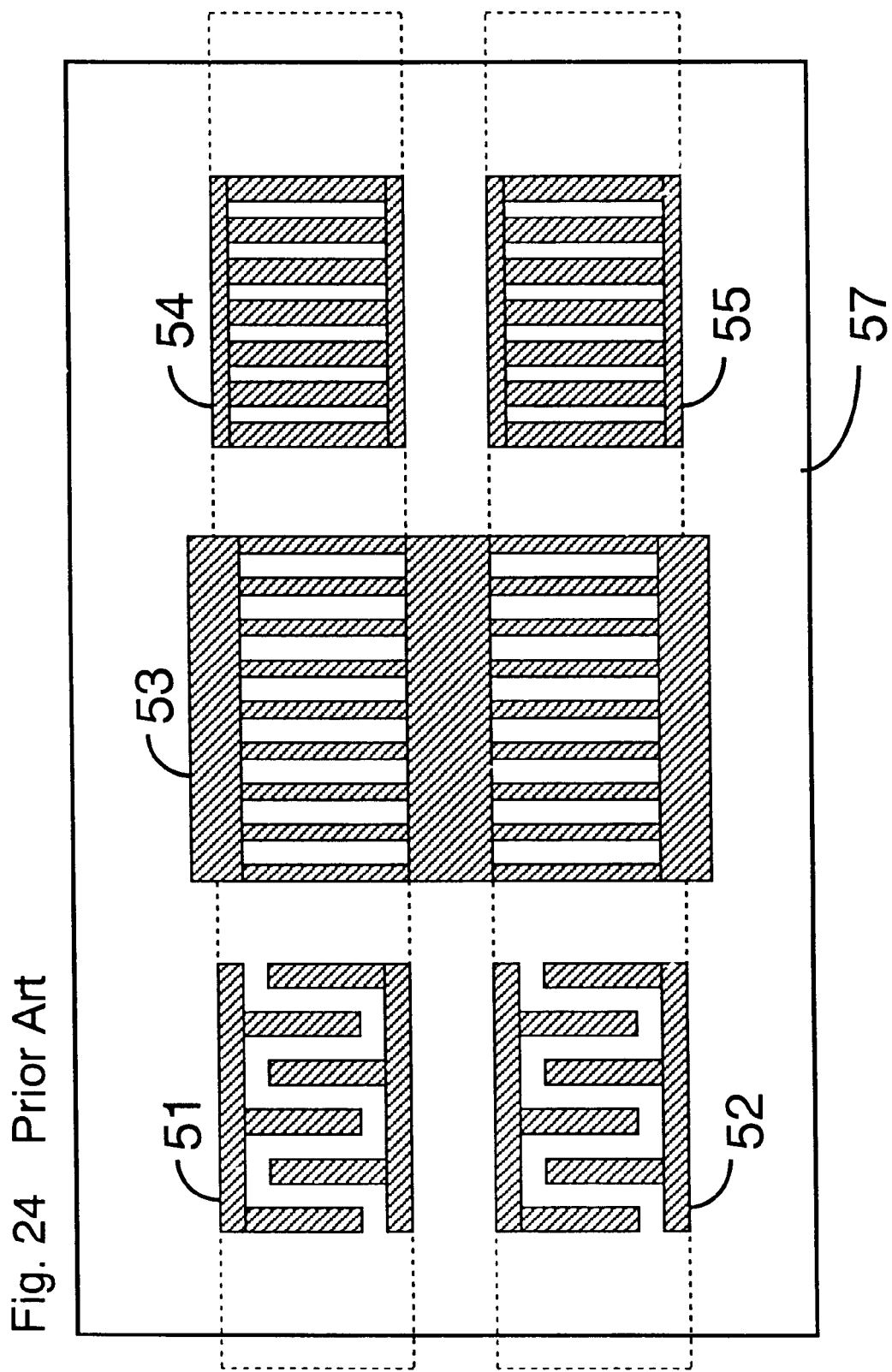
FIG. 24 is a schematic view illustrating the construction of an example of a conventional surface acoustic wave filter.

In FIG. 24, illustrated is the construction of an example of a surface acoustic wave filter comprised of an input IDT, an output IDT, a coupler and reflectors.

In such a surface acoustic wave filter using the reflectors, the frequency characteristics of the input and output IDTs and the reflectors are combined to give the frequency characteristic of the surface acoustic wave filter. Here, the obtained frequency characteristic of the surface acoustic wave filter changes depending upon the difference between the width of a main lobe in a reflection band of the reflectors and the width of a main lobe in a passband of the IDTs. First, this change in the characteristic is explained.

Figure 25A:
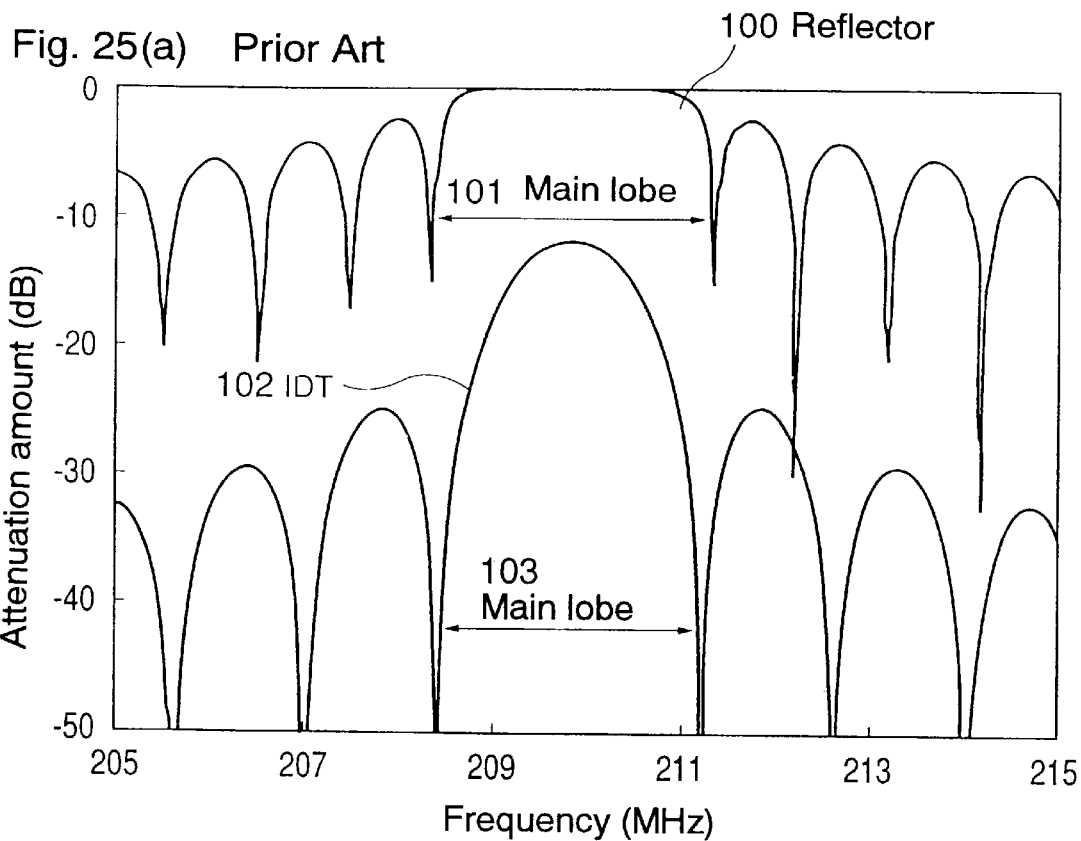
FIGS. 25(a) and 25(b) are graphs showing the frequency characteristic where the width of a main lobe of a reflector is larger than the width of a main lobe of an IDT.
Figure 25B:
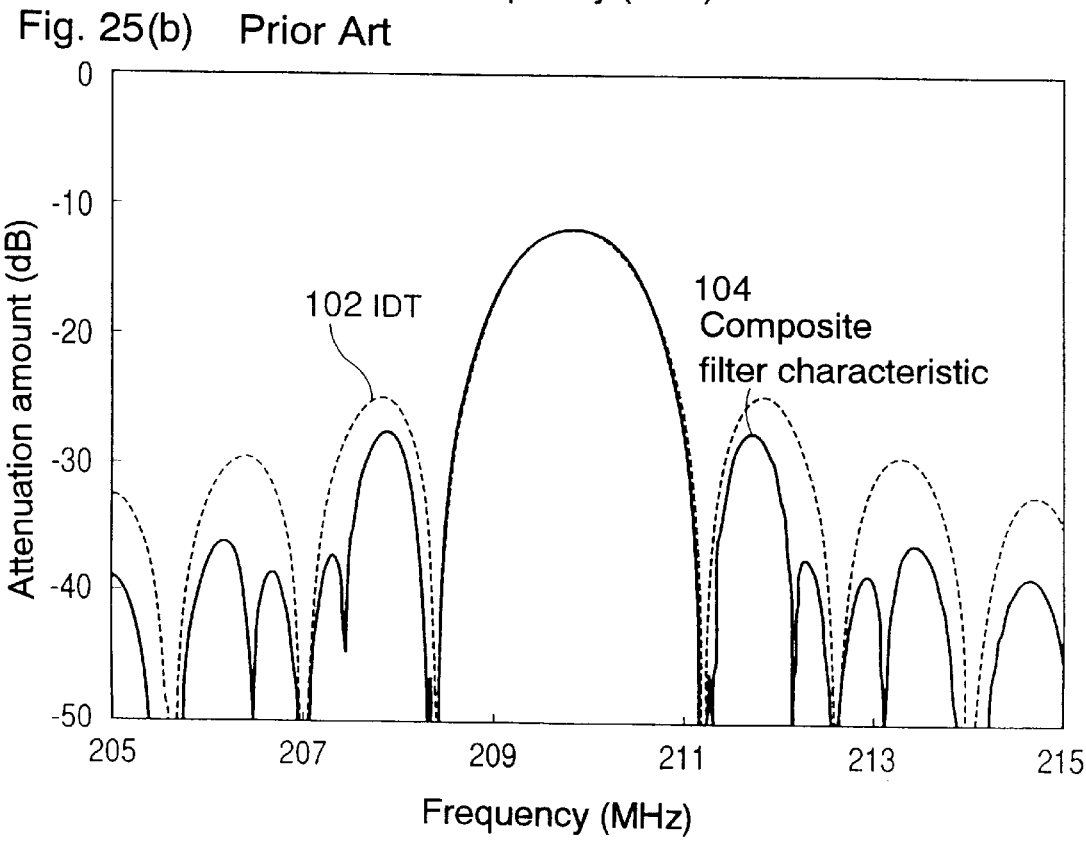

FIGS. 25(a) and 25(b) are graphs of the frequency characteristics where the width 101 of the main lobe of the reflectors is larger than the width 103 of the main lobe of the IDTs. FIG. 25(a) shows the frequency characteristic 100 of the reflectors and the frequency characteristic 102 of the input and output IDTs, separately, and FIG. 25(b) shows the frequency characteristic 104 of the surface acoustic wave filter into which the frequency characteristic of the reflectors and that of the input and output IDTs are combined. The passband of the composite frequency characteristic of the surface acoustic wave filter is almost defined by the characteristic of the main lobe 103 of the IDTs. The characteristic of the reflectors contributes little, and the shape factor is not improved as compared with the IDTs alone.

Figure 26A:
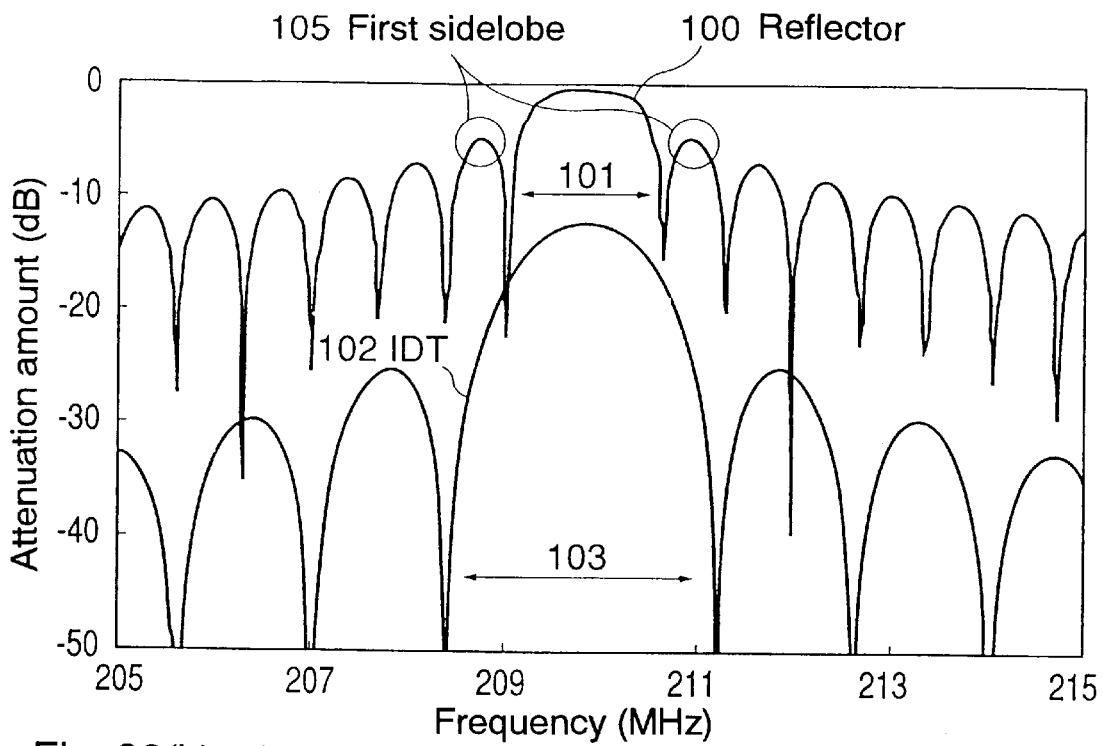
FIGS. 26(a) and 26(b) are graphs showing the frequency characteristic where the width of a main lobe of a reflector is smaller than the width of a main lobe of an IDT.
Figure 26B:
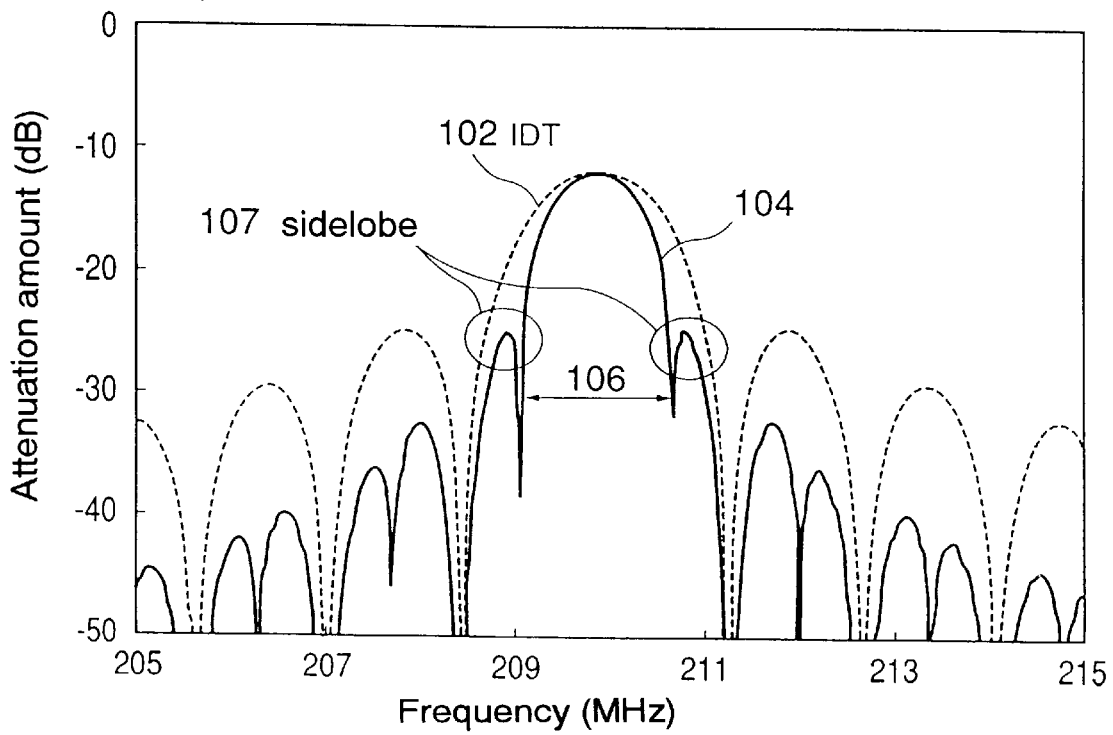

On the other hand, FIGS. 26(a) and 26(b) are graphs of the frequency characteristics where the width of the main lobe of the reflectors is smaller than the width of the main lobe of the IDTs. FIG. 26(a) shows the frequency characteristic 100 of the reflectors and the frequency characteristic 102 of the input and output IDTs, separately, and FIG. 26(b) shows the frequency characteristic 104 of the surface acoustic wave filter into which the frequency characteristic of the reflectors and that of the input and output IDTs are combined.

In this case, FIG. 26(b) shows an greatly improved shape factor near the passband as compared with the frequency characteristic 102 of the IDTs alone, because the combined frequency characteristic 104 of the filter exhibits a narrow width at a main lobe 106 where attenuation amount is the smallest. Accordingly, in order to improve the shape factor in the surface acoustic wave filter using the reflectors, it is necessary that the main lobe of the reflectors be smaller than the main lobe of the IDTs, as shown in FIGS. 26(a) and 26(b).

However, in the FIG. 26(b) showing the improved shape factor, sidelobes 107 appear by the main lobe 106. These sidelobes 107 can be considered to be caused by the first sidelobes 105 of the reflectors in FIG. 26(a). If the first sidelobes 105 of the reflectors are suppressed, then the first sidelobes 107 of the surface acoustic wave filter can be suppressed, which leads to further improvement of the shape factor of the frequency characteristic of the surface acoustic wave filter.

Figure 27A:
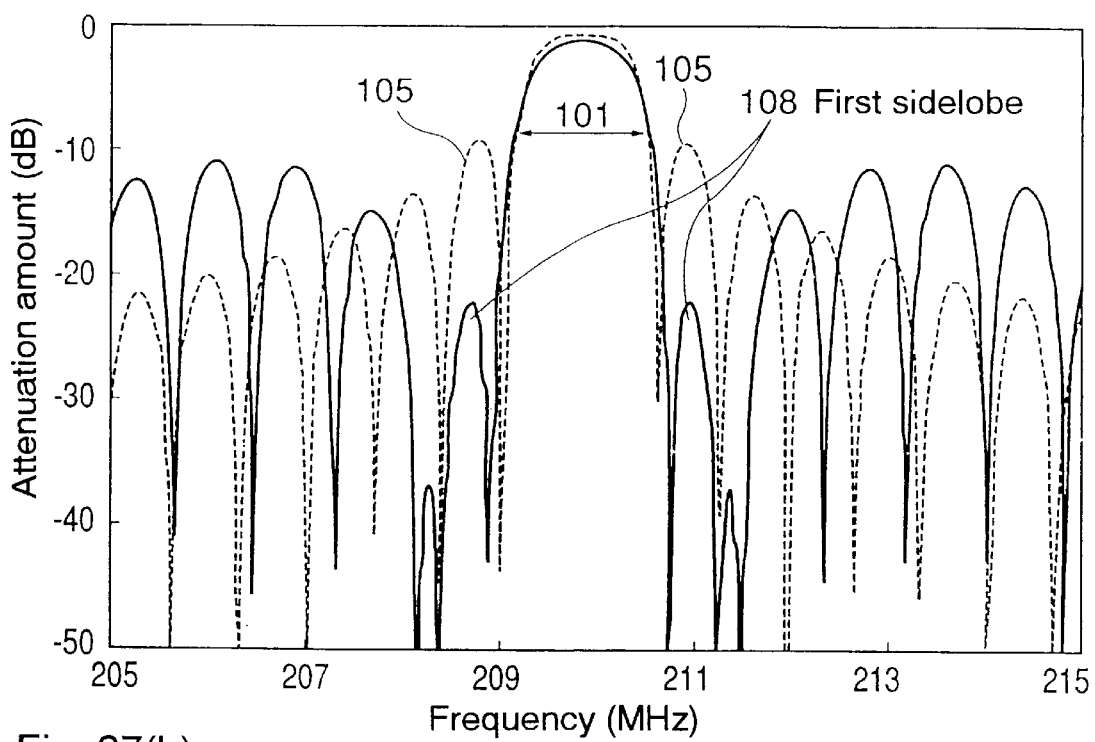
FIGS. 27(a) and 27(b) are graphs showing the frequency characteristic where the first sidelobe of a reflector is suppressed in accordance with the present invention.
Figure 27B:
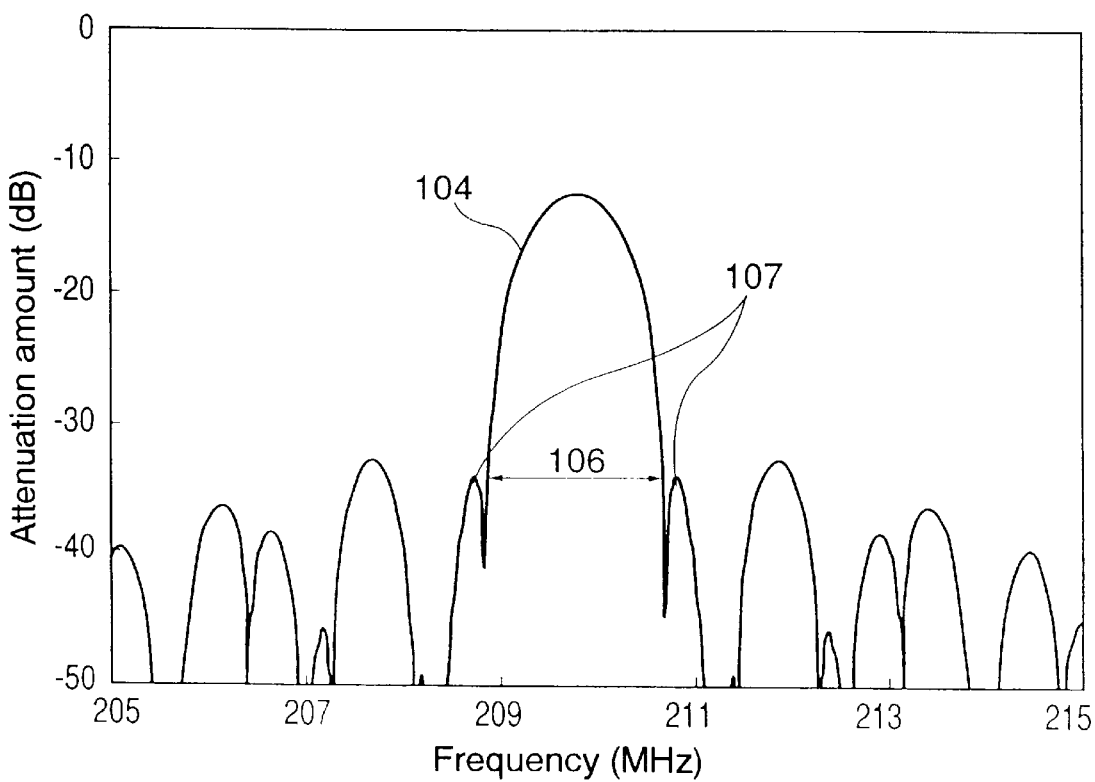

FIG. 27(a) is a graph showing the frequency characteristic of an example of a reflector in which the first sidelobes are suppressed in accordance with the present invention. FIG. 27(b) is a graph of the frequency characteristic of a surface acoustic wave filter composed of this reflector and IDTs. It can be confirmed that the sidelobes 107 near the main lobe 106 are suppressed. Consequently, it is understood that a characteristic with small sidelobes 107 near the main lobe 106 and with good shape factor can be achieved if only the first sidelobes 108 of the reflector are suppressed.

The present invention is to suppress the first sidelobes of the frequency characteristic of the reflector by use of a specific construction as detailed below so as to obtain a good frequency characteristic for a surface acoustic wave filter using the reflector.

The construction of the reflector which allows suppression in the first sidelobes is now explained with several examples, in which the width of the whole perturbation members of the reflector in a left-to-right direction in the figures corresponds to 100 perturbation members unless otherwise indicated.

EXAMPLE 1

Figure 1B:
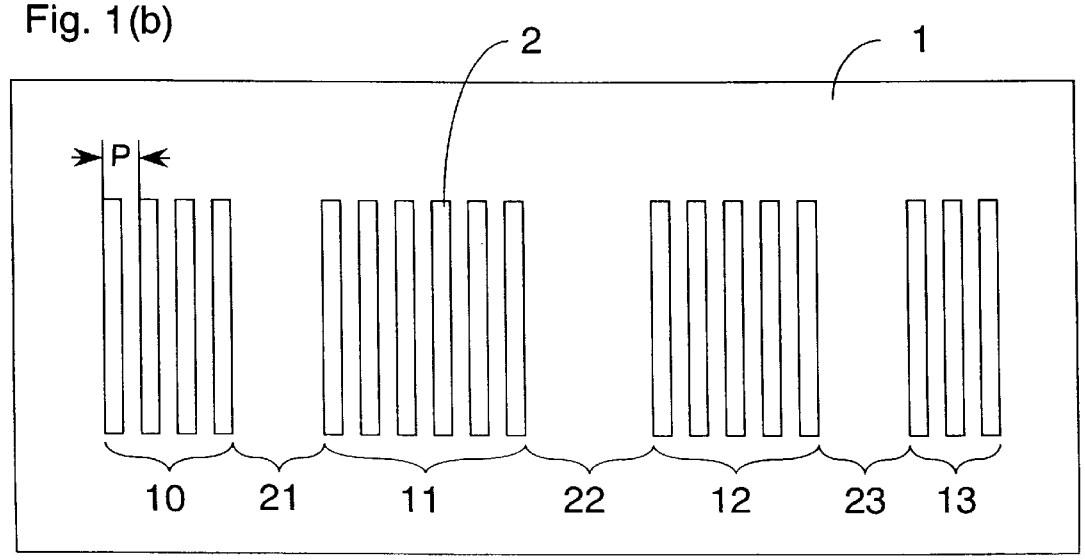

FIGS. 1(a) and 1(b) are schematic views illustrating the construction of reflectors in accordance with Example 1 of the present invention.

In FIGS. 1(a) and 1(b), the reflectors are constructed by arranging a plurality of perturbation members 2 in designated positions on a piezoelectric substrate 1, for which an ST cut crystal or the like is used. The perturbation members 2 are formed of a thin film of a metal material such as aluminum or the like. The perturbation members 2 are arranged at a constant period P which corresponds to half the wavelength of a surface acoustic wave (referred to as SAW hereinafter) excited by an input IDT not shown.

In the present invention, some of perturbation members 2 arranged at the constant period are absent in a plurality of regions (referred to as free-surface regions hereinafter). These free-surface regions are characterized in that at least two adjacent perturbation members 2 are removed therefrom.

In FIG. 1(a), the zone where the perturbation members 2 exist is separated into three regions 11, 12 and 13 by two free-surface region 21 and 22.

In the example of FIG. 1(a), free-surface region 21 corresponds to a space for two perturbation members 2 if they were disposed. Likewise, free-surface region 22 corresponds to a space for four perturbation members.

In FIG. 1(b), the zone where perturbation members 2 exist is separated into four regions 10, 11, 12 and 13 by three free-surface region 21, 22 and 23.

In the example of FIG. 1(b), free-surface regions 21 and 23 each have a width corresponding to two perturbation members and free-surface regions 22 has a width corresponding to three perturbation members.

Further, in the case where the number of free-surface regions 21 and 22 is two as in FIG. 1(a), the number of perturbation members in central region 12 of the regions where the perturbation members exist (referred to as perturbation member-existing regions hereinafter) may be larger than the number of perturbation members in other regions 11 and 13 located at end portions.

Figure 2:
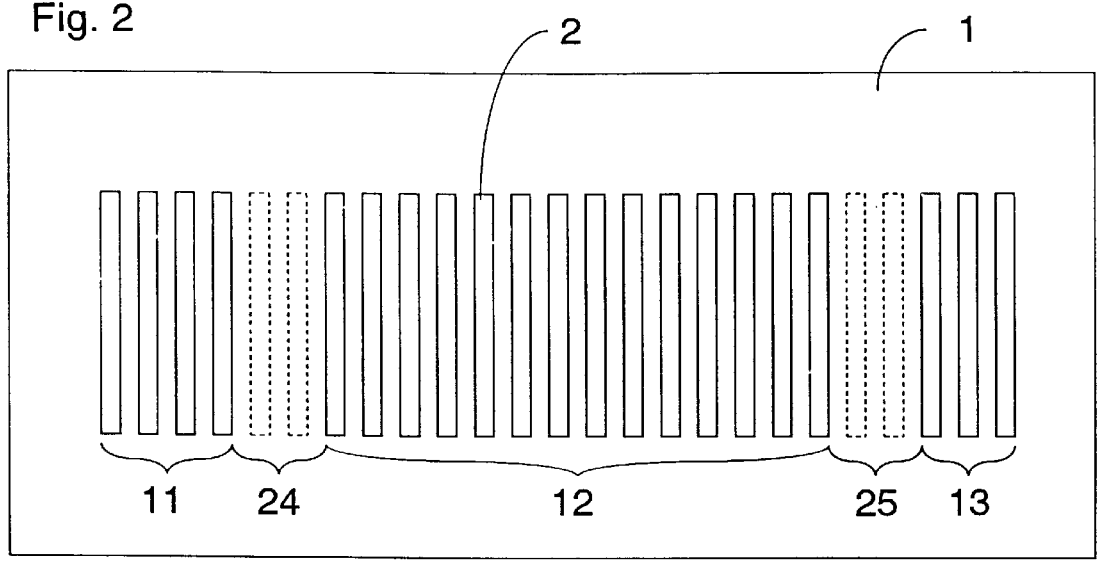
FIG. 2 is a schematic view illustrating the construction of a reflector in accordance with Example 1 of the present invention (in which the number of perturbation members in the central region is larger than that in other regions)

FIG. 2 shows the construction of an example of a reflector in this case. Here, free-surface regions 24 and 25 each have a width corresponding to two perturbation members, but may have different widths. Also their widths may correspond to three or more perturbation members.

In FIGS. 1(a) and 1(b), among the perturbation member-existing regions, the number of perturbation members 2 in the region 11 or 10 on the left is different from that in the region 13 on the right, but may be the same.

FIG. 3 shows the construction of an example of a reflector in which the numbers of perturbation members in perturbation member-existing regions 14 and 15 at both ends are the same. Here, the widths of free-surface regions 24 and 25 also correspond to two perturbation members, but their widths may be different.

In any of the reflectors shown in FIGS. 1 to 3, perturbation members 2 are separated individually. However, in the case where perturbation members 2 are formed of a thin film of a metal material, all perturbation members in the same region may be electrically short-circuited with use of the same thin metal film.

FIG. 4 shows the construction of an example of a reflector in which the perturbation members are electrically short-circuited as described above. In FIG. 4, reference numeral 3 denotes a perturbation member formed of a thin metal film and reference numeral 4 denotes a metal film for short-circuiting perturbation members 3.

Next, explained is the suppression of the first sidelobes in the frequency characteristics of the reflectors according to the present invention having the construction as described above.

FIG. 5 shows graphs of the frequency characteristics of reflectors from which perturbation members are withdrawn and * from which no perturbation members are withdrawn. A line indicated by reference numeral 120 represents the frequency characteristic of the reflector without withdrawal and lines indicated by reference numerals 121 and 122 represent the frequency characteristics of the reflectors from which six and twelve perturbation members are withdrawn, respectively.

Here, an ST cut crystal is used as a piezoelectric substrate 1. In the reflector from which perturbation members are withdrawn, 100 perturbation members are formed of a thin film of aluminum on the piezoelectric substrate (also referred to as aluminum strips hereafter).

The aluminum strips have a thickness of 0.2 μm, a period of P(=7.5 μm), a width a of 3.75 μm in a direction of arrangement (in the left-to-right direction in the figure), and an interval b of 3.75 μm. Here, P=a+b (see FIGS. 1(a) and 1(b)).

In the reflectors from which perturbation members are withdrawn, the total numbers of withdrawn perturbation members are four, six, ten and twelve. The perturbation members are withdrawn from two regions 24 and 25, namely, two free-surface regions which are symmetric to each other.

Figures 6, 7:
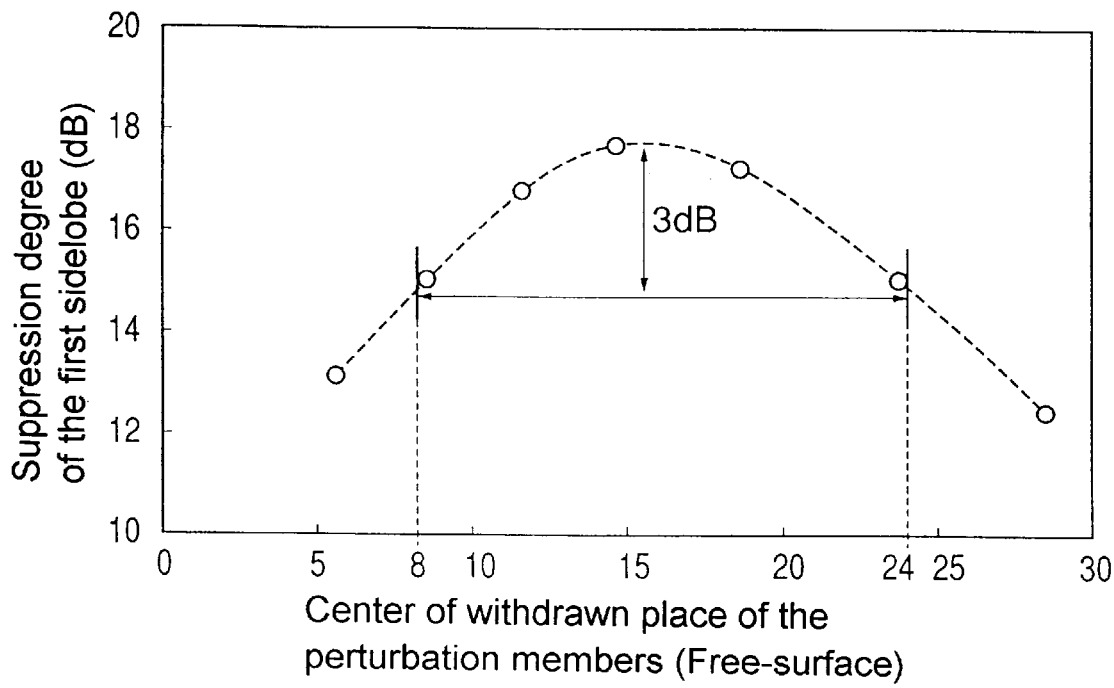
FIG. 6 is a table showing the positions of withdrawn perturbation members in cases where the first sidelobe is suppressed most.
FIG. 7 is a graph showing a relationship between the positions of withdrawn perturbation members and the degree of suppression of the first sidelobe.

It has been confirmed that in these reflectors, the first sidelobes of the frequency characteristic is suppressed most if perturbation members are removed from the positions listed in FIG. 6. The numerals in FIG. 6 indicate the positions of the perturbation members from the left in FIG. 3, with the perturbation member located at the leftmost in FIG. 3 numbered first and that located at the rightmost numbered 100th.

For example, FIG. 6 shows that, if the total number of withdrawn perturbation members is four and the 14th and 15th perturbation members (region 24) and the 86th and 87th perturbation members (region 25) from the left are removed, then the first sidelobes in the frequency characteristic of the reflector is suppressed most.

In FIG. 6, a region where two neighboring perturbation members (14 and 15) are withdrawn as a unit corresponds to the region 24 in FIG. 3, and similarly a region where two neighboring perturbation members (86 and 87) are withdrawn as a unit corresponds to the region 25 in FIG. 3. In the two regions, perturbation members do not exist.

The first sidelobes are suppressed most when the perturbation members at the positions shown in FIG. 6 are removed. However, it has also been confirmed that the first sidelobes are suppressed if perturbation members at other positions (for example, four perturbation members at positions 10, 11, 90 and 91) are withdrawn, as compared with the case where no perturbation members are withdrawn.

It is understood from the frequency characteristics of FIG. 5 that in the first sidelobes 110 and 111, the attenuation amount is the smallest with the reflector without withdrawal (line 120) and the attenuation amount increases, that is, the first sidelobes are suppressed more, as more perturbation members are withdrawn (lines 121 and 122).

From the above, if two neighboring perturbation members of those arranged at a constant period are removed as a set from two regions, the first sidelobes (110, 111) of the frequency characteristic of the reflector can be suppressed as compared with the case where no perturbation members are withdrawn. FIG. 5 also shows that the more perturbation members are withdrawn, the more the first sidelobes are suppressed.

It should be noted that, in the case of withdrawal of eight perturbation members, the first sidelobes are suppressed most if the perturbation members at positions 12, 13, 14, 16, 85, 87, 88 and 89 are removed, unlike the cases shown in FIG. 6. That is, the first sidelobes are rendered the smallest by further removing two perturbation members (positions 16 and 85) in addition to the two free-surface regions (positions 12, 13, 14 and positions 87, 88, 89).

Next, explained is a case where perturbation members are withdrawn from varied regions.

FIG. 7 is a graph showing a relationship between the center of a place where perturbation members are withdrawn (plotted in abscissa) and the degree of suppression of the first sidelobes of the reflector (plotted in ordinate). Here, the center of the place where perturbation members are withdrawn means the center of the free-surface region and is represented by the number of perturbation members counted from the left. For example, referring to FIG. 6, if the total number of withdrawn perturbation members is four, then the center is 14.5; if it is six, the center is 15; and if it is twelve, the center is 14.5.

The degree of suppression in the ordinate represents the attenuation amount (dB) at the first sidelobe with respect to the main lobe in the frequency characteristic.

According to FIG. 6, the first sidelobes are suppressed most if the center of the free-surface region is around position 14 from the left, regardless of at what positions perturbation members are withdrawn. In FIG. 7, the degree of suppression of the first sidelobes are also the largest when the center is around position 14 to 15. As the center of the free-surface region approaches the left end, the degree of suppression of the first sidelobes decreases, and as the center shifts from position 15 toward the right, the degree of suppression of the first sidelobes decreases.

Generally, the more the attenuation amount at the first sidelobes becomes as compared with the attenuation amount at the main lobe, the better the shape factor is. The larger the degree of suppression of the first lobes plotted in the abscissa in FIG. 7, the better the shape factor is.

For example, supposing that a range for the degree of suppression of the first sidelobes from the optimal value (maximum value) down to a level 3 dB below is a range satisfying specifications required of the reflector, it is understood to be sufficient from FIG. 7 that the center of the free-surface region may be around position 8 to position 24 from the left.

In the examples of the present invention, the total number of the perturbation members of the reflector is 100. As shown in FIG. 6, in the case of providing two surface-free regions, the centers of the surface-free regions may be at positions of about 8 to 24% and of about 77 to 93% of the perturbation members from the left for satisfying the specifications required of the reflector.

In order to suppress the first sidelobes most, the centers of the free-surface regions may preferably be at positions of about 13 to 15% and of about 86 to 88% of the perturbation members from the left, regardless of the number of perturbation members withdrawn according to any of the cases of FIG. 6.

EXAMPLE 2

Next, explained are examples in which the number of perturbation members in the perturbation member-existing regions is varied.

FIG. 6 shows the withdrawal positions of perturbation members in the cases where the total number of withdrawn perturbation members is 4, 6, 10 and 12. In any of the cases, the remaining perturbation members are separated into three groups (see FIG. 3).

Figures 8, 9:
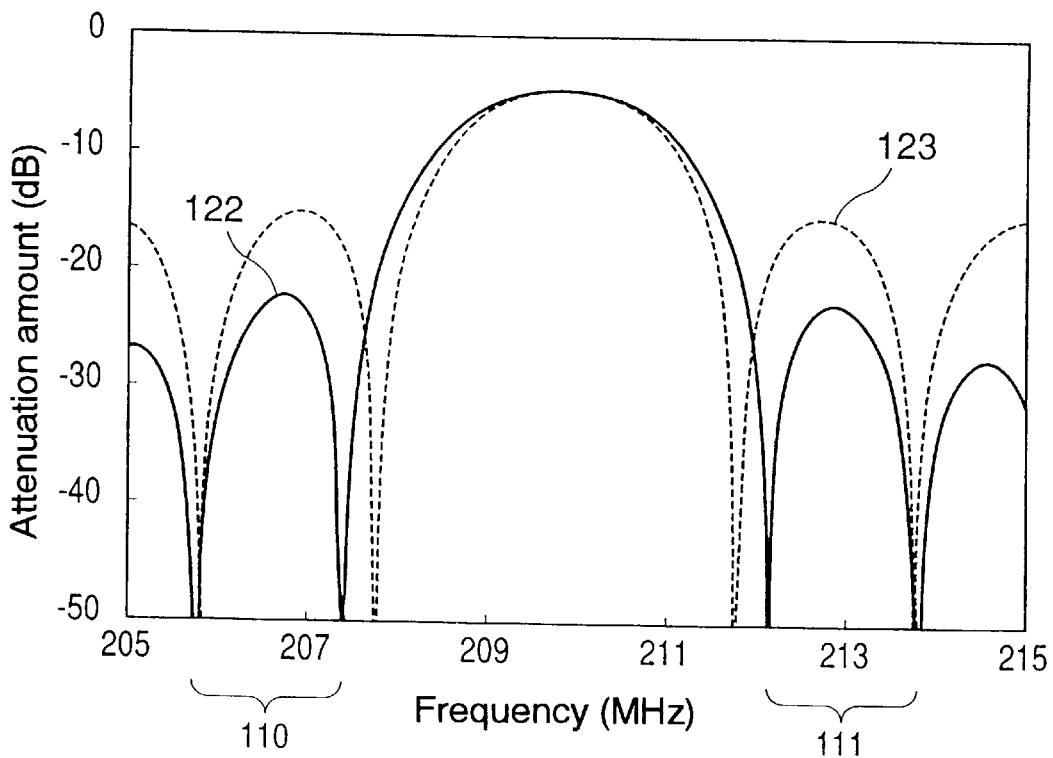
FIG. 8 is a table showing the number of perturbation members in perturbation member-existing regions in connection with FIG. 6.
FIG. 9 is a graph of the frequency characteristics of reflectors having a varied number of perturbation members in the central region of the perturbation member-existing regions in accordance with Example 2 of the present invention.

FIG. 8, corresponding to FIG. 6, shows the number of perturbation members in each of the groups. For example, FIG. 8 show that, when the total number of withdrawn perturbation members is twelve, the number of perturbation members in the group on the left end is 11 (perturbation members from No. 1 to No. 11), that in the central group is 66 (perturbation members from No. 18 to No. 83) and that in the group on the right end is 11 (perturbation members from No. 90 to No. 100).

According to FIG. 8, in any of the cases different in the number of withdrawn perturbation members, the number of perturbation members in the central group is the largest. That is, if the perturbation member-existing regions are three as in FIG. 3, a reflector with suppressed first sidelobes is obtained by setting the number of perturbation members in the central region larger than the number of perturbation members in other two groups, that is, the two perturbation member-existing regions at both ends.

FIG. 9 is a graph showing the frequency characteristics of reflectors having different numbers of perturbation members in their central perturbation member-existing regions for comparison according to this Example 2. A line of reference numeral 122 in FIG. 9 is for a case of 66 perturbation members in the central region, and a line of reference numeral 123 is for a case of 28 perturbation members in the central region.

The line of reference numeral 122 is the same as that for the case of the withdrawal of 12 perturbation members in total shown in FIG. 5 and corresponds to the case where the number of perturbation members (=66) in the central region is larger than that (=11) in the regions at both ends.

On the other hand, the line of reference numeral 123 represents the case where the total number of withdrawn perturbation members are also 12 but the number of perturbation members in the central region is 28 and that in the regions at both ends is 30, respectively. That is, the line of reference numeral 123 represents the frequency characteristic of the case where the number of perturbation members in the central region is smaller than that in the regions at both ends.

Comparison of line 122 and line 123 shows that the first sidelobes are suppressed more in line 122.

Therefore, it is understood from FIG. 9 that, in the case where two free-surface regions and three perturbation member-existing regions exist, the first sidelobes of the frequency characteristic of the reflector can be suppressed more if the number of perturbation members in the central perturbation member-existing region is larger than that in other two regions.

In the above Examples 1 and 2 and FIG. 9, the remaining perturbation members are separated into three groups, but these are not limiting examples. Even if the remaining perturbation members are separated into four or more groups, the first sidelobes can be suppressed by setting the number of perturbation members of a "perturbation member-existing region" at the center or near the center larger than that in other perturbation member-existing regions.

EXAMPLE 3

Next, explained are examples in which the number of free-surface regions is varied.

FIGS. 10(a) and 10(b) show the construction of reflectors in accordance with Example 3 of the present invention.

FIG. 10(a) shows an example in which free-surface regions are provided in two places (24, 25) and the central region of three perturbation member-existing regions (12, 14, 15) has the largest number of perturbation members, corresponding to the case shown in FIG. 6 where the total number of withdrawn perturbation members is 12. That is, the number of perturbation members in each of regions 14 and 15 is 11, the number of perturbation members in the central region is 66, and the width of each of regions 24 and 25 corresponds to six perturbation members.

FIG. 10(b) shows an example in which free-surface regions are provided in four places (24, 25, 26, 27) and the central region of separated five perturbation member-existing regions (12, 14, 15, 16, 17) has the largest number of perturbation members.

Here, the number of perturbation members in regions 14 and 15 is 11, the number of perturbation members in regions 16 and 17 is 6, and the number of perturbation members in region 12 is 50. The width of regions 24 and 25 corresponds to six perturbation members, and the width of regions 26 and 27 corresponds to two perturbation members. In both FIGS. 10(a) and 10(b).

Figure 11:
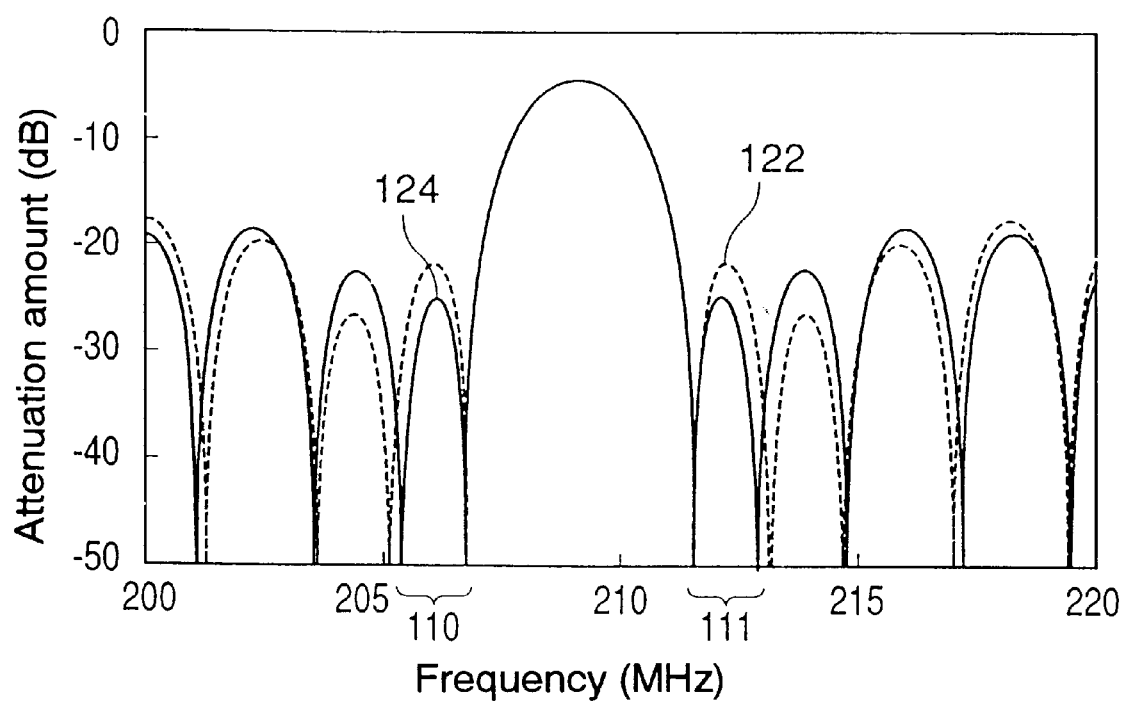
FIG. 11 is a graph of the frequency characteristics of the reflectors shown in FIGS. 10(a) and 10(b)

FIG. 11 is a graph showing the frequency characteristics of the reflectors shown in FIGS. 10(a) and 10(b).

Reference numeral 122 denotes a line representative of the frequency characteristic of the reflector of FIG. 10(a) and corresponds to the line in FIG. 9 for the reflector having two free-surface regions.

On the other hand, reference numeral 124 denotes a line representative of the frequency characteristic of the reflector of FIG. 10(b), which has four free-surface regions. According to this graph, the first sidelobes of the line 124 are more suppressed than those of line 122.

It is understood from FIGS. 10(a), 10(b) and 11 that the free-surface regions are not limited to two places but that four free-surface regions can suppress the first sidelobes. Generally, it can be said that the first sidelobes can be suppressed more by setting more perturbation members in the central region than in other regions and increasing the number of free-surface regions, though the suppression of the first sidelobes also depends upon the number of drawn perturbation members.

EXAMPLE 4

Next, explained is an example in which free-surface regions, i.e., regions where perturbation members do not exist, are provided symmetrically.

FIGS. 12(a) and 12(b) show the construction of examples of reflectors in accordance with the present invention.

FIG. 12(a) is the same figure as FIG. 10(a), in which three perturbation member-existing regions (12, 14, 15) are symmetrically arranged with respect to the central line of the perturbation members.

On the other hand, FIG. 12(b) shows the construction in which three perturbation member-existing regions (12, 14, 15) are asymmetrically arranged with respect to the central line. The number of perturbation members in region 14 at the left end is five, that in central region 12 is 66 and that in region 15 at the right end is 17. In both FIG. 12(a) and FIG. 12(b), the total number of withdrawn perturbation members is 12.

Figure 13:
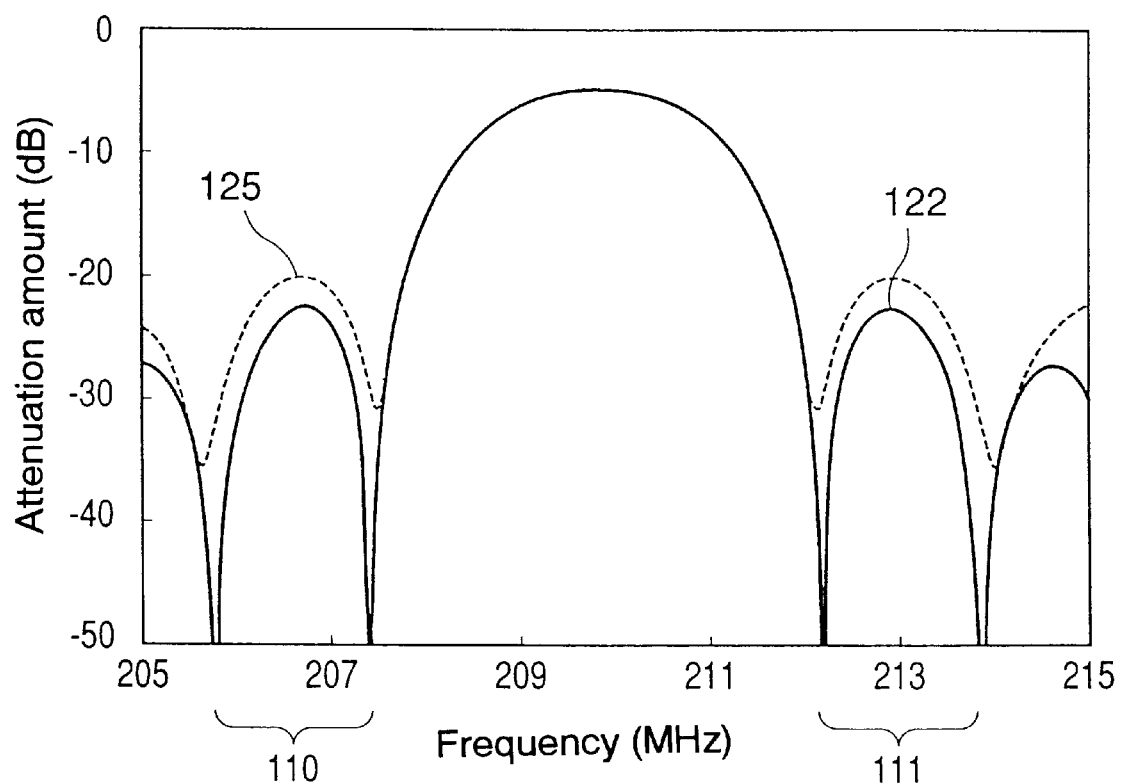
FIG. 13 is a graph of the frequency characteristics of the reflectors shown in FIGS. 12(a) and 12(b)

FIG. 13 is a graph for comparison showing the frequency characteristics of the reflectors shown in FIG. 12(a) and FIG. 12(b).

Reference numeral 122 denotes a line representative of the frequency characteristic of the reflector of FIG. 12(*a*) which is the same as line 122 in FIG. 11 and shows the frequency characteristic of a reflector having symmetric perturbation member-existing regions.

On the other hand, reference numeral 125 denotes a line representative of the frequency characteristic of the reflector of FIG. 12(*b*), which has perturbation member-existing regions arranged asymmetrically. According to this graph, the first sidelobes of line 122 are more suppressed than the first sidelobes of line 125. If there are odd-number perturbation existing regions, the first sidelobes of the frequency characteristic of a reflector can be suppressed more by making equal the numbers of perturbation members in the left-end and right-end regions and arranging the perturbation members symmetrically with respect to the central line of the perturbation members.

EXAMPLE 5

In the above-detailed examples, the perturbation members are formed of thin-film metal strips (e.g., aluminum strips) disposed on the piezoelectric substrate, but they may be formed of grooves disposed on the surface of the piezoelectric substrate as shown in the following example.

FIGS. 14(*a*) to 14(*c*) show the construction of a reflector according to the present invention in which the perturbation members are formed of grooves. FIG. 14(*a*) is a plan view as seen from above, FIG. 14(*b*) is a sectional view taken along line X–X' in FIG. 14(*a*), and FIG. 14(*c*) is an enlarged view of a groove portion of FIG. 14(*b*). These figures correspond to FIG. 3. The perturbation members formed of aluminum strips in FIG. 3 are replaced with grooves in FIGS. 14(*a*) to 14(*c*).

For obtaining the same frequency characteristic as that of the reflector of FIG. 3 with this construction of FIGS. 14(*a*) to 14(*b*), it suffices to set the reflection factor per groove equal to the reflection factor per aluminum strip. For example, supposed that the reflector of FIG. 3 is composed of a piezoelectric substrate of an ST-X quartz (42.45° Y–X: crystal) and aluminum thin-film strips of a period p=7.5 $\mu$m, a width =3.75 $\mu$m and a thickness h1 =0.21 $\mu$m, the reflection factor R1 per this thin-film strip is calculated by the following formula:

$$R1=0.00196+0.19 \cdot h1/p=0.00728,$$

according to "Surface Acoustic Wave Technology Handbook (published by Ohm Sha in November 1991)."

The reflection factor R2 per groove formed on the piezoelectric substrate is calculated by 0.30·h2/p, wherein h2 represents the depth of the groove. For R1=R2, R1=0.00728=0.30·h2/p=R2.

Provided that p=7.5 $\mu$m, the above formula gives h2=0.182 $\mu$m.

Therefore, as shown in FIG. 14(*c*), it is possible to obtain a reflector having the same frequency characteristic as that of the reflector of FIG. 3 by setting the depth h2, width w2 and period p of the groove to 0.18 $\mu$m, 3.75 $\mu$m and 7.5 $\mu$m, respectively.

EXAMPLE 6

Next, explained is an example in which perturbation members having a different period from the period of the perturbation members in the perturbation member-existing regions are provided in the regions where perturbation members are withdrawn in the above examples.

Generally, the velocity of a surface acoustic wave in a region where perturbation members exist periodically is different from that in a free-surface region where perturbation members do not exist. If the SAW velocities in the two kinds of regions are different, the characteristic of the reflector becomes asymmetric with respect to the center frequency.

Figure 15:
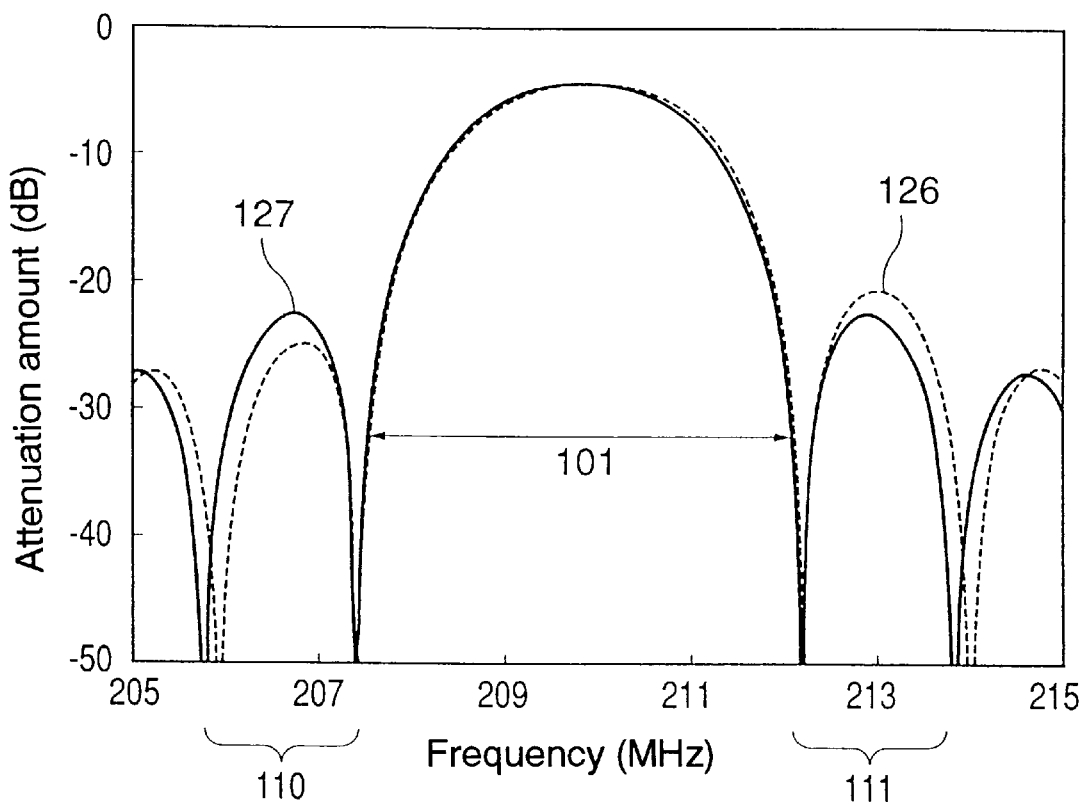
FIG. 15 is a graph showing the frequency characteristic of a reflector in accordance with Example 6 of the present invention in which the velocities of a surface acoustic wave in two regions are different.

FIG. 15 shows a graph of the frequency characteristic of a reflector in which the SAW velocities in the two kinds of regions are different.

In the reflector used here, the total number of withdrawn perturbation members is 12 and the numbers of perturbation members in the perturbation member-existing regions are 11, 66 and 11 from the left, as shown in FIG. 8.

Reference numeral 126 in FIG. 15 is representative of the frequency characteristic of the reflector in which the SAW velocities in the two kinds of regions are different. The velocity of an actually propagated SAW is 3,159 m/s in the free-surface region where perturbation member do not exist and 3,139 m/s in the perturbation members existing regions. On the other hand, reference numeral 127 is representative of the frequency characteristic of a reflector in which the SAW velocities in the two kinds of regions are the same (=3,139 m/s).

As understood from reference numeral 126 in FIG. 15, if the SAW velocities in the two kinds of regions are different, the sizes of the first sidelobes on a lower frequency side (110) and on a higher frequency side (111) of the main lobe is asymmetric. The first sidelobe (111) on the higher frequency side is larger.

Figure 16:
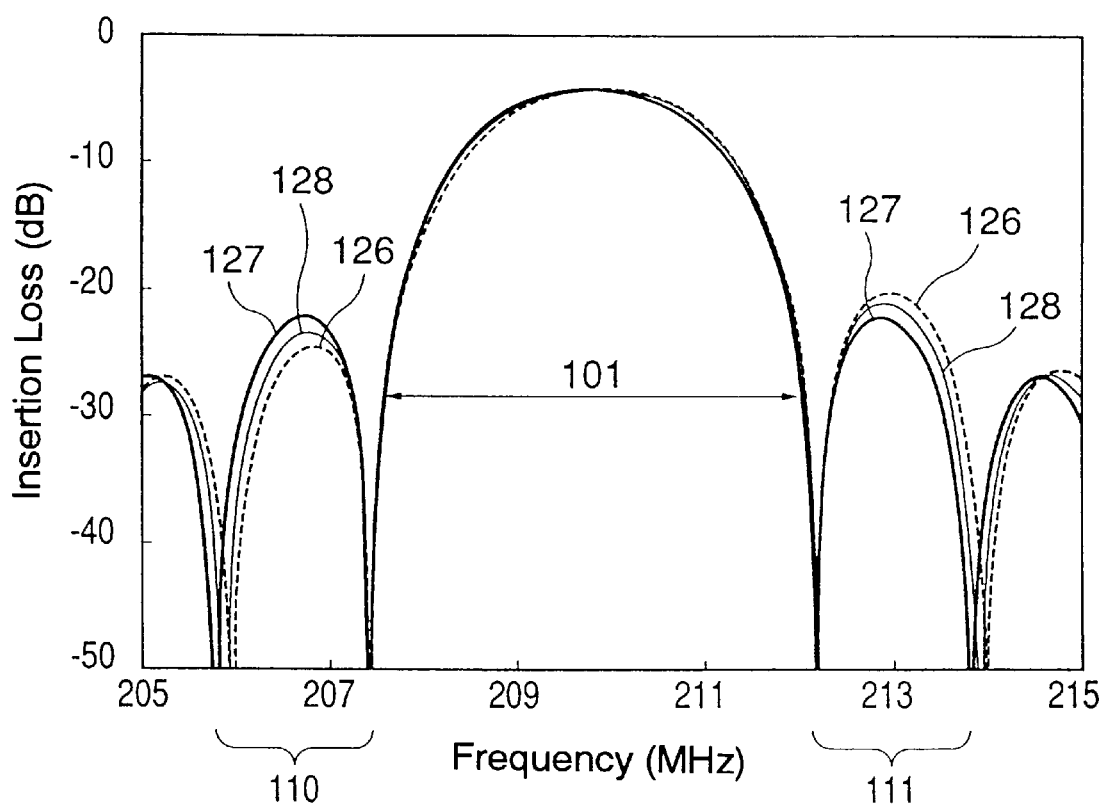
FIG. 16 is a graph showing the frequency characteristic of a reflector in accordance with Example 6 of the present invention in which the velocities of a surface acoustic wave in two regions are different but closer to each other than in the reflector of FIG. 15.

Next, FIG. 16 shows a graph of the frequency characteristic (128) of a reflector in which the SAW velocity in the free-surface regions is 3,159 m/s and approaches the SAW velocity in the perturbation member-existing regions, i.e., 3,139 m/s. In FIG. 16, it is confirmed from comparison of the lines of reference numerals 126 and 128 that the difference between attenuation amounts at the first sidelobes on the higher-frequency side (111) and the lower-frequency side (110) becomes smaller in the case (reference numeral 128) where the SAW velocity in the free-surface regions having no perturbation members is closer to the SAW velocity (=3,139 m/s) in the perturbation member-existing regions than in the case where the SAW velocity in the free-surface regions (3,159 m/s) is far from the SAW velocity in the perturbation member-existing regions. Therefore, the a symmetricalness of the first sidelobes on the lower and higher frequency sides of the main lobe can be suppressed by reducing the difference between the SAW velocities in the perturbation member-existing regions and the free-surface regions.

Figure 17:
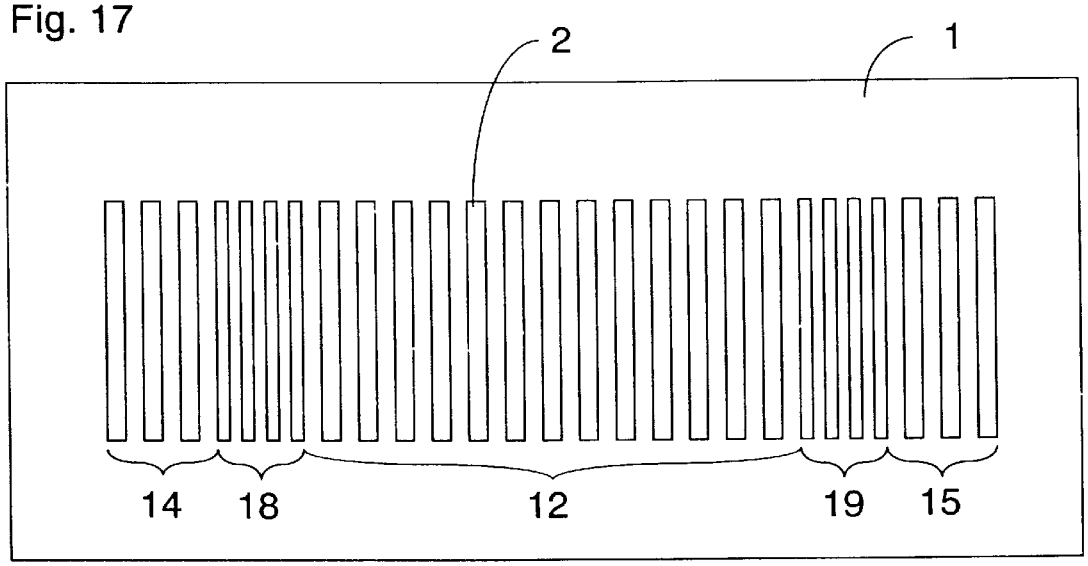
FIG. 17 is a schematic view illustrating the construction of a reflector in accordance with the present invention in which perturbation members are disposed at a different period in a region where perturbation members have not existed.

In order to reduce the difference between the SAW velocities in the two kinds of regions, for example, perturbation members having a different period from the period of the existing perturbation members are disposed in the free-surface regions. FIG. 17 shows the construction of a reflector in which perturbation members 18 and 19 are disposed at a different period in the region where perturbation members do not exist in the above examples (e.g., the regions 24 and 25 in FIG. 3).

Here, the period of perturbation members 12, 14 and 15 is 7.5 $\mu$m and the period of perturbation members 18 and 19 is 5.7 $\mu$m.

If perturbation members 18 and 19 having a different period from that of perturbation members 12, 14 and 15 are thus disposed in the free-surface regions, perturbation members 18 and 19 do not contribute to the reflection of SAWs because they have the different period. However, the SAW velocity in the regions of the perturbation members of the different period approaches the SAW velocity in the perturbation member-existing regions, as compared with the regions having no perturbation members at all. Therefore, the difference between the attenuation levels at the first sidelobes 110 and 111 on the lower and higher frequency sides of the main lobe decreases and the first sidelobes are suppressed as a whole.

Figure 18:
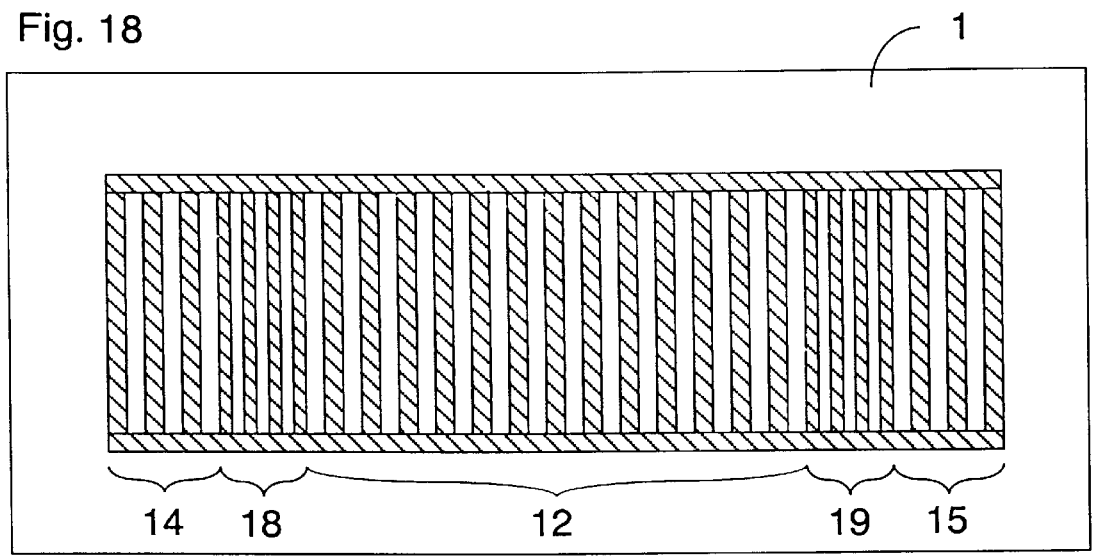
FIG. 18 is a schematic view illustrating the construction of a reflector in accordance with Example 6 of the present invention in which two kinds of perturbation members are electrically short-circuited with thin metal films of the same material.
Figure 19:
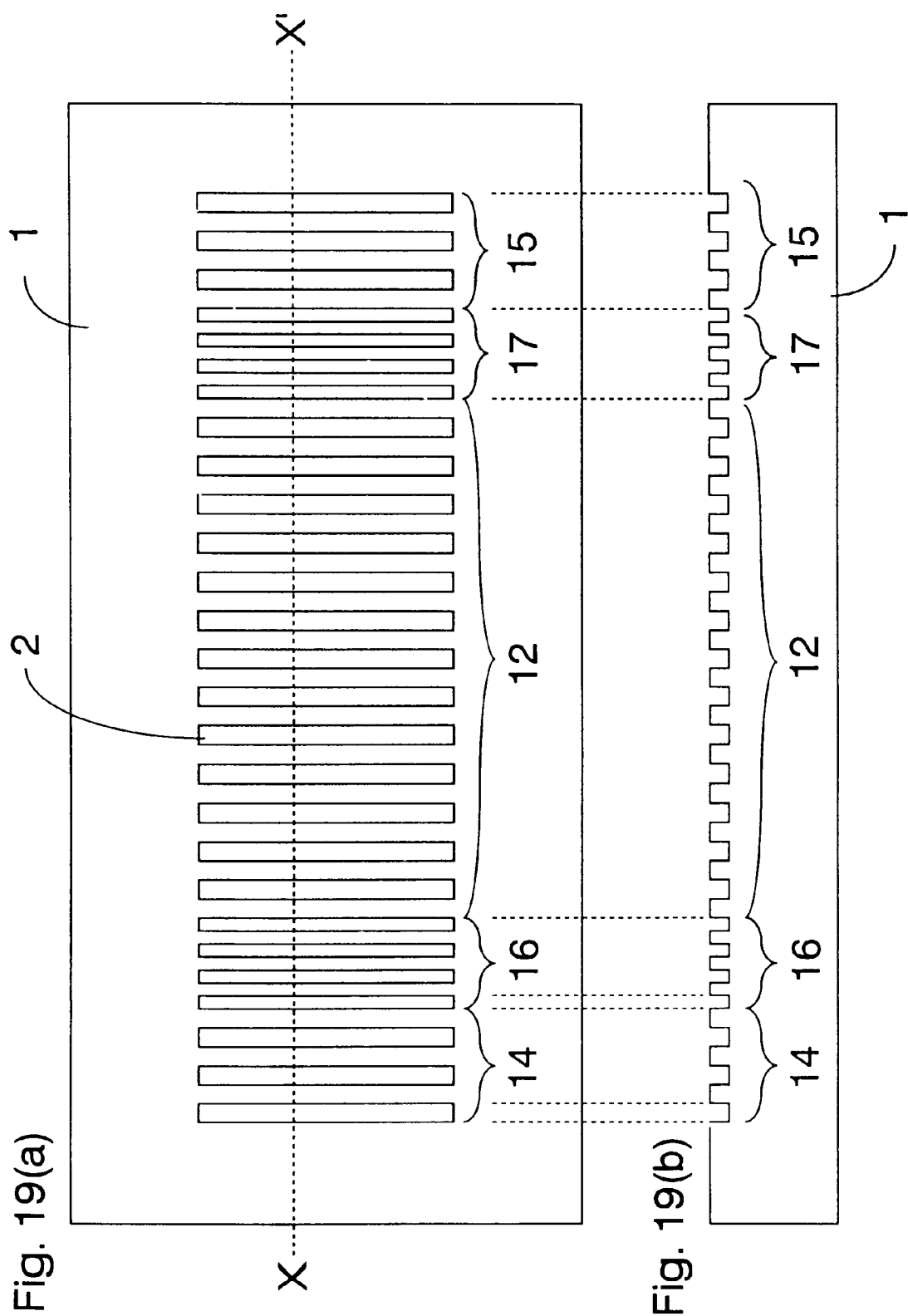
FIGS. 19(a) and 19(b) are schematic views Illustrating the construction of a reflector in accordance with Example 6 of the present invention in which all perturbation members are formed of grooves.

These two kinds of perturbation members (12, 14, 15 and 18, 19) may be formed of the same material, for example, of strips of a metal such as Al, Cu, Au, Ti, Mg or the like. Further, also usable are alloys of combinations of a plurality of these metals and a multi-layered film of these metals. By thus using the same material, both the perturbation members (12, 14, 15) and the perturbation members (18, 19) having different periods can be formed by a single step, which facilitates the production process. Also, as shown in FIG. 18, the two kinds of perturbation members may be short-circuited with a thin metal film of the same material. Further, as shown in FIG. 19, these perturbation members may be formed as grooves on the surface of the piezoelectric substrate in place of thin metal strips. Here, reference numerals 16 and 17 denote regions where exist perturbation members of a different cycle. In this case, the production process is also facilitated.

EXAMPLE 7

Here, shown is an example of a surface acoustic wave filter using a reflector in accordance with the present invention. The construction of the surface acoustic wave filter is shown in FIG. 20.

The surface acoustic wave filter is composed of a piezoelectric substrate 57 of a 36° Y–X :quartz, input and output IDTs 51 and 52, reflectors 54 and 55 and waveguide directional couplers 53 and 56 using grated waveguide paths. The SAW emitted by input IDT 51 reaches reflectors 54 and 55 via waveguide directional couplers 53 and 56, is reflected by the reflectors 54 and 55, passes the waveguide directional couplers 53 and 56 again and is received by output IDT 52. Here, input and output IDTs 51 and 52, waveguide directional couplers 53 and 56 and reflector 54 and 55 are all formed of Al of 0.21 $\mu$m thickness. The period of input and output IDTs 51 and 52 is 15 $\mu$m, the number of electrode pairs of input IDT 51 is 95 and that of output IDT 52 is 100.

Figure 20:
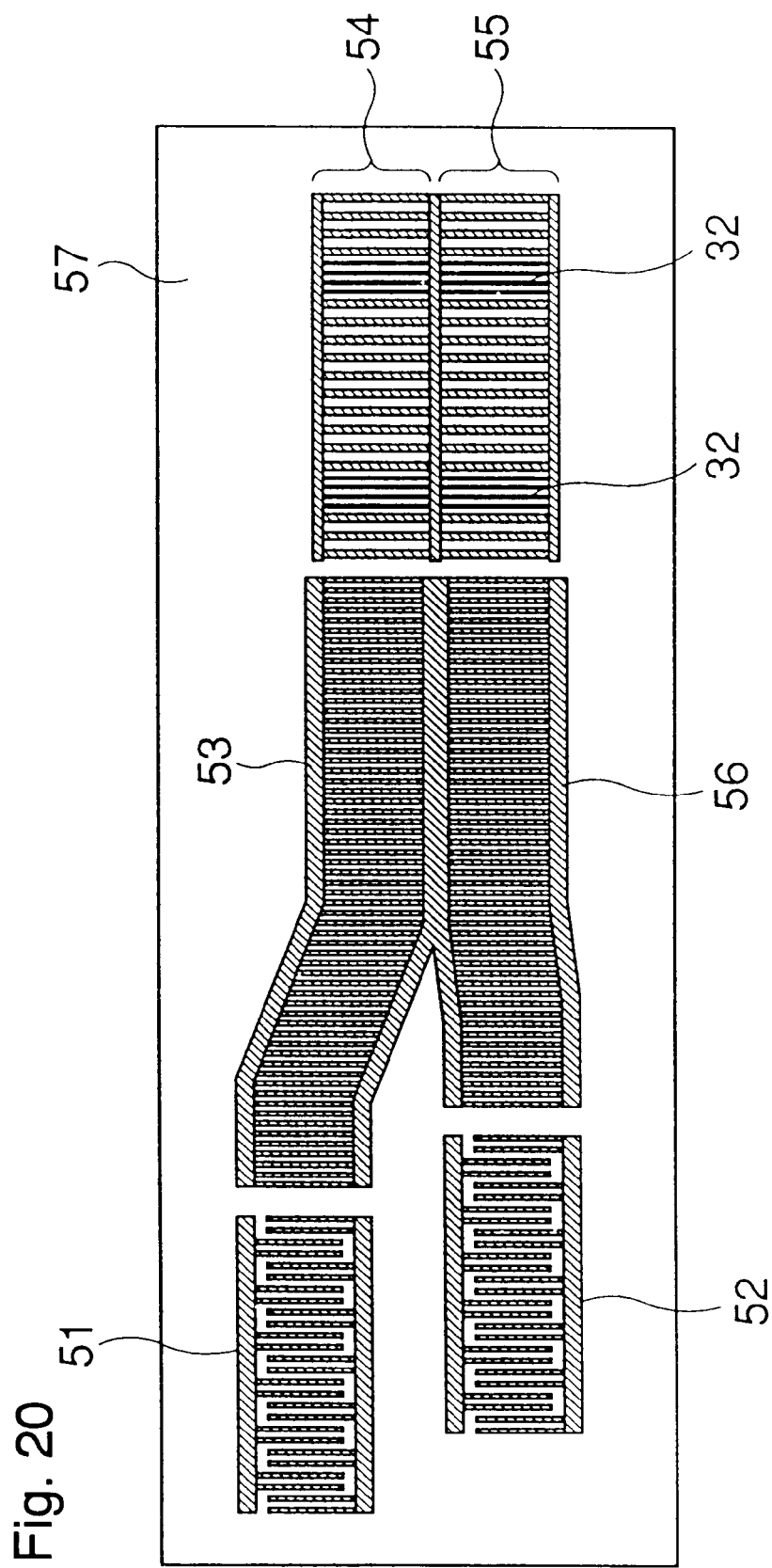
FIG. 20 is a schematic view illustrating the construction of an example of a surface acoustic wave filter using a reflector in accordance with the present invention.
Figure 21:
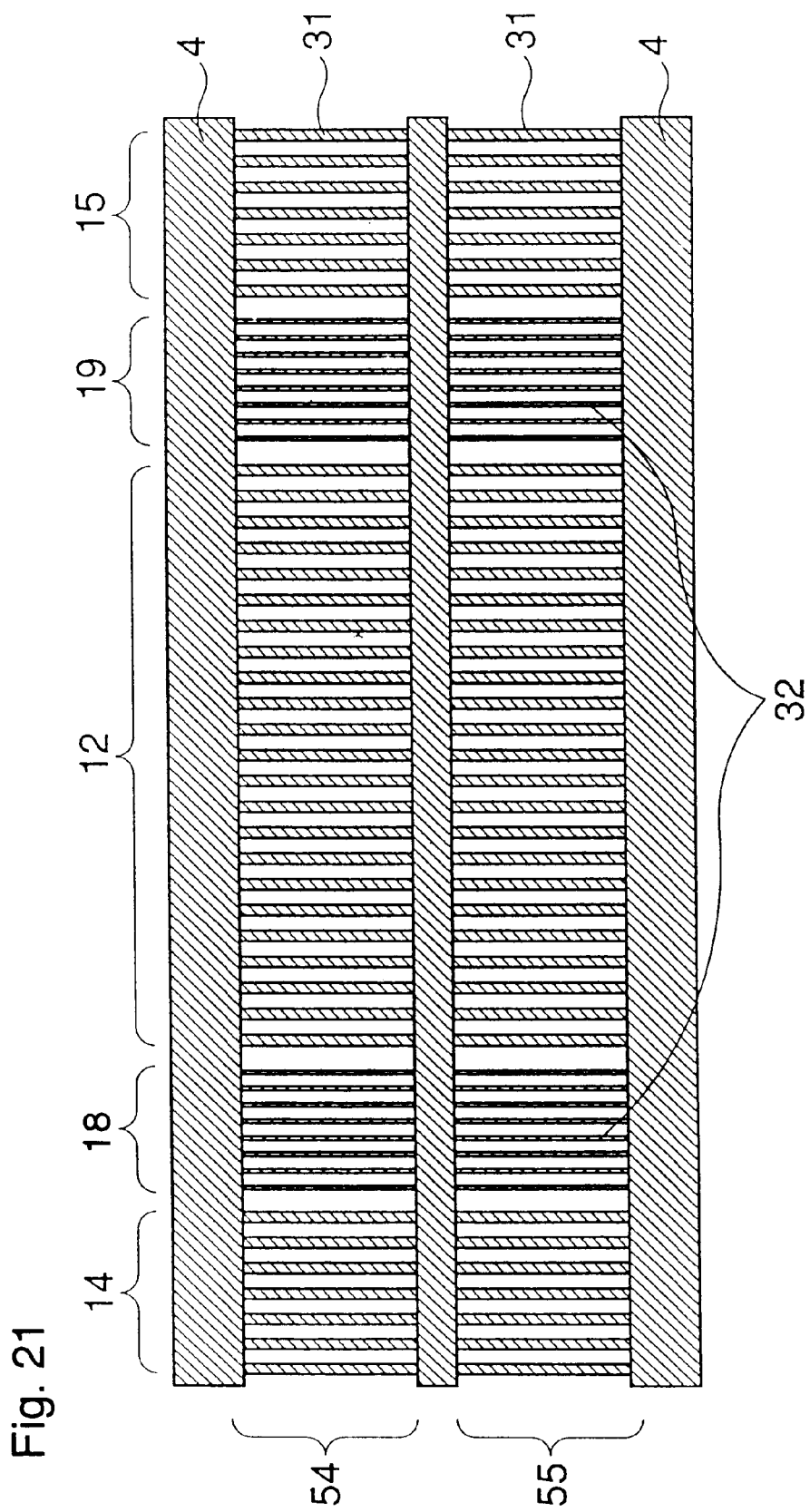
FIG. 21 is an enlarged view of the reflector shown in FIG. 20.

FIG. 21 is an enlarged view of reflectors 54 and 55 of FIG. 20.

In FIG. 21, reflectors 54 and 55 are formed of aluminum strips (in regions 12, 14, 15). The period P of the aluminum strips is 7.5 $\mu$m and the width of the aluminum strip is 3.75 $\mu$m. The aluminum strips of the reflectors are selectively withdrawn. In each of two regions 18 and 19, twenty-one adjacent aluminum strips are removed. Accordingly, the aluminum strips existing in the zone where the perturbation members exist are separated into three groups (regions 12, 14, 15). The numbers of aluminum strips in regions 14, 12 and 15 are 18, 161 and 18, respectively. Further, free-surface regions 18 and 19 where the aluminum strips are removed are provided with strips of the same material of width of 2.85 $\mu$m at a period of 5.7 $\mu$m.

Figure 22:
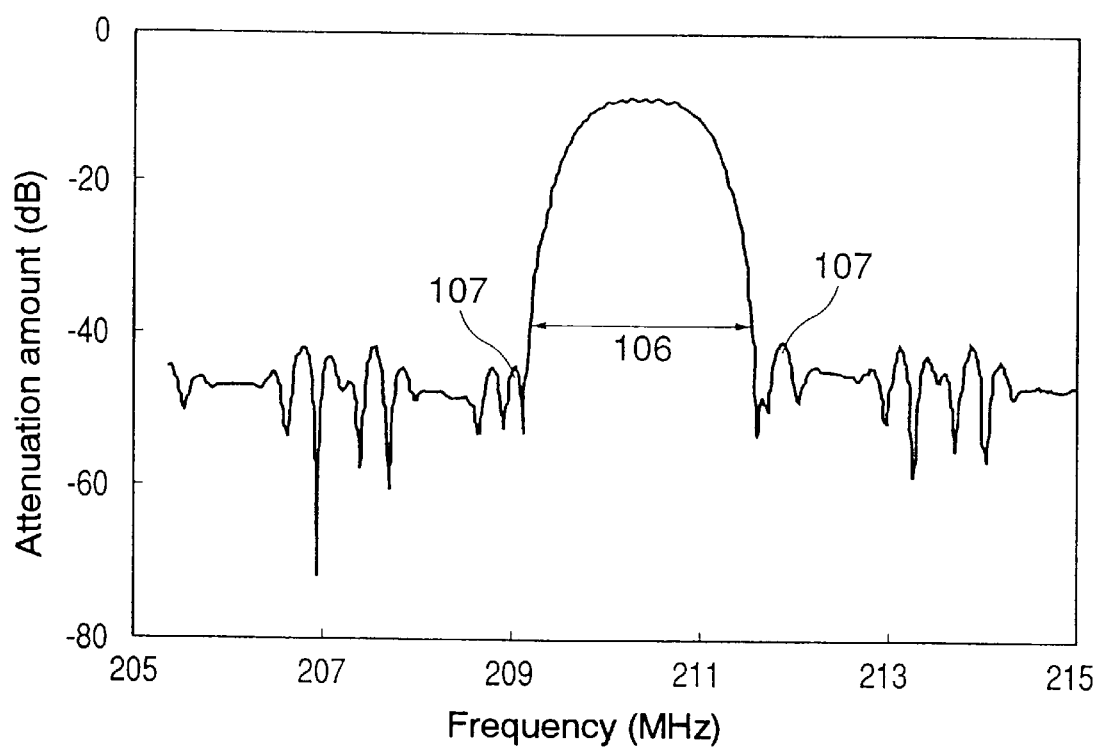
FIG. 22 is a graph of the frequency characteristic of the surface acoustic wave filter shown in FIG. 20.
Figure 23:
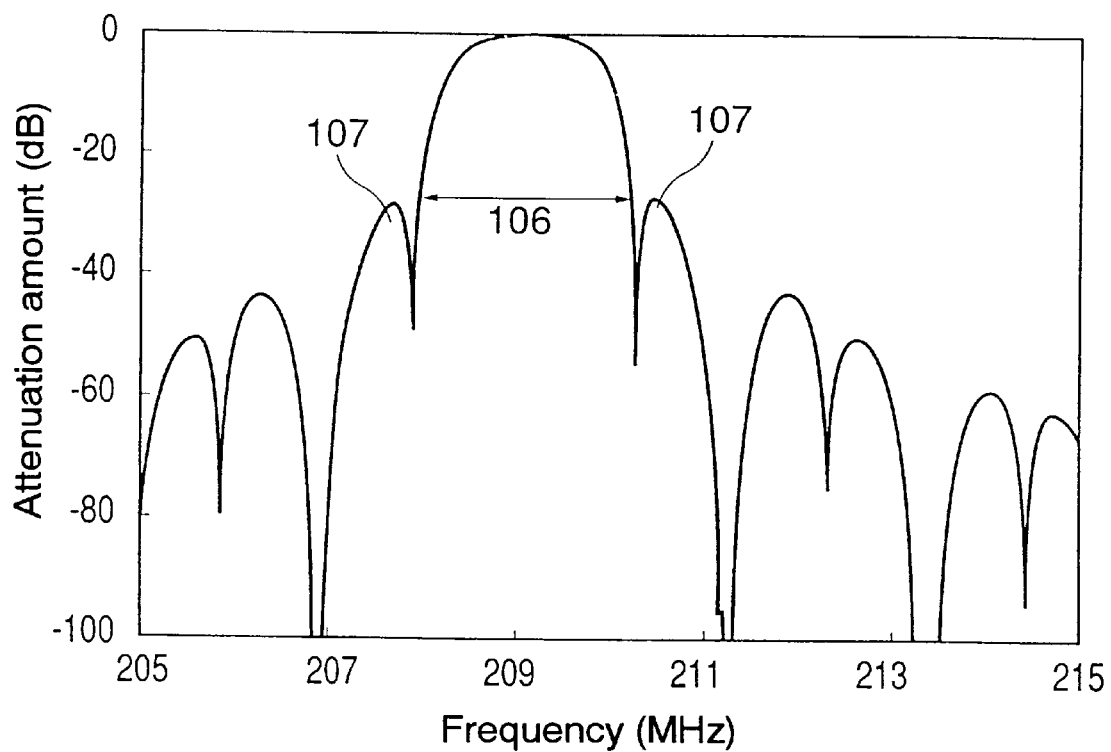
FIG. 23 is a graph of the frequency characteristic of a surface acoustic wave filter using a reflector from which no perturbation members are withdrawn.

FIG. 22 shows a graph of the frequency characteristic of the surface acoustic wave filter of FIG. 20, and FIG. 23 shows a graph of the frequency characteristic of a surface acoustic wave filter using a reflector having a total of 239 aluminum strips none of which are not withdrawn.

It is confirmed from comparison of FIG. 22 with FIG. 23 that, because the first sidelobes of the surface acoustic wave filters of FIG. 22 and FIG. 23 attenuate by about 31 dB and about 29 dB, respectively, with respect to the respective main lobes, the reflector of the present invention provides a better characteristic with suppressed sidelobes also for a surface acoustic wave filter.

According to the present invention, the first sidelobes of the frequency characteristic of a surface acoustic wave reflector can be suppressed. Therefore, the invention can also have an effect in suppressing the first sidelobes in the frequency characteristic of a surface acoustic wave filter using the surface acoustic wave reflector of the present invention.

Particularly, since the reflector has a plurality of free-surface regions which have a width corresponding to the width of perturbation members arranged adjacently and which do not have perturbation members, it is possible to suppress the first sidelobes of the surface acoustic wave reflector.

Further, since, among three groups of perturbation members remaining on the piezoelectric substrate, the number of perturbation members included in the central group is larger than the number of perturbation members in other groups at both ends, it is possible to suppress the first sidelobes of the surface acoustic wave reflector.

Since, among the three groups of perturbation members remaining on the piezoelectric substrate, the numbers of perturbation members included in the groups at both ends are equal, it is possible to suppress the first sidelobes of the surface acoustic wave reflector.

Since the SAW velocity in the free-surface region from which perturbation members are removed is close to that in the perturbation member-existing region, it is possible to reduce the deference between the levels of the first sidelobes on the lower frequency side and the higher frequency side of the main lobe of the reflector.

Especially, because perturbation members are formed in the free-surface regions from which perturbation members are removed, at a second period which is different from the period of the existing perturbation members, it is possible to reduce the difference between the attenuation levels on the lower frequency side and the higher frequency side of the main lobe of the reflector.

What is claimed is:

1. A surface acoustic wave reflector comprising:

a piezoelectric substrate; and a plurality of first perturbation members arranged at a first period on the piezoelectric substrate, wherein a plurality of free-surface regions are formed where no first perturbation members exist in an arrangement of the first perturbation members, and wherein, in the case where the number of the free-surface regions is an even number and a zone where the first perturbation members exist is separated into an odd number of regions in a direction of propagation of a surface acoustic wave by the free-surface regions, the number of first perturbation members in a central region of said odd number of regions is larger than the number of first perturbation members in other regions.

2. A surface acoustic wave reflector according to claim 1, wherein the numbers of first perturbation members in the other regions of said odd number of regions than the central region are symmetric with respect to the central region.

3. A surface acoustic wave reflector comprising:

a piezoelectric substrate; and a plurality of first perturbation members arranged at a first period on the piezoelectric substrate, wherein a plurality of free-surface regions are formed where no first perturbation members exist in an arrangement of the first perturbation members, wherein, in the case where the number of the free-surface regions is two and a zone where the first perturbation members are arranged is separated into three regions in a direction of propagation of a surface acoustic wave by the free-surface regions, the number of first perturbation members in a central region of said three regions is larger than the number of first perturbation members in other regions.

4. A surface acoustic wave reflector according to claim 3, wherein the numbers of first perturbation members in other regions at both ends of said three regions than the central region are the same.

5. A surface acoustic wave reflector according to claim 3 or 4, wherein the centers of the two free-surface regions are located at a position of 8 to 24% and at a position of 77 to 93% of the first perturbation members from the left with respect to a zone where the whole first perturbation members of the surface acoustic wave reflector exist.

6. A surface acoustic wave reflector according to any one of claims 1 to 4, wherein second perturbation members are added to the free-surface regions so that the velocity of a surface acoustic wave propagating in the free-surface regions approaches the velocity of a surface acoustic wave propagating in the regions where the first perturbation members exist.

7. A surface acoustic wave reflector according to claim 5, wherein second perturbation members are added to the free-surface regions so that the velocity of a surface acoustic wave propagating in the free-surface regions approaches the velocity of a surface acoustic wave propagating in the regions where the first perturbation members exist.

8. A surface acoustic wave reflector according to any one of claims 1 to 4, wherein a plurality of second perturbation members are added to the free-surface regions at a second period different from the first period.

9. A surface acoustic wave reflector according to claim 5, wherein a plurality of second perturbation members are added to the free-surface regions at a second period different from the first period.

10. A surface acoustic wave reflector according to claim 8, wherein the second period is shorter than the first period.

11. A surface acoustic wave reflector according to claim 9, wherein the second period is shorter than the first period.

12. A surface acoustic wave reflector according to any one of claims 1 to 4, wherein the perturbation members are formed of electrically short-circuited metal strips or electrically opened metal strips.

13. A surface acoustic wave reflector according to claim 8, wherein the first perturbation members in the zone where the first perturbation members exist and the second perturbation members added to the free-surface regions are all formed of the same material.

14. A surface acoustic wave reflector according to claim 10, wherein the first perturbation members in the zone where the first perturbation members exist and the second perturbation members added to the free-surface regions are all formed of the same material.

15. A surface acoustic wave reflector according to any one of claims 1 to 4, wherein the first perturbation members are formed of grooves periodically arranged on the piezoelectric substrate.

16. A surface acoustic wave reflector according to claim 5, wherein the first perturbation members are formed of grooves periodically arranged on the piezoelectric substrate.

17. A surface acoustic wave reflector according to claim 6, wherein the first perturbation members are formed of grooves periodically arranged on the piezoelectric substrate.

18. A surface acoustic wave reflector comprising:

a piezoelectric substrate; and a plurality of first perturbation members arranged at a first period on the piezoelectric substrate, wherein a plurality of free-surface regions are formed where no first perturbation members exist in an arrangement of the first perturbation members, and wherein second perturbation members are added to the free-surface regions so that the velocity of a surface acoustic wave propagating in the free-surface regions approaches the velocity of a surface acoustic wave propagating in the regions where the first perturbation members exist.

19. A surface acoustic wave reflector comprising:

a piezoelectric substrate; and a plurality of first perturbation members arranged at a first period on the piezoelectric substrate, wherein a plurality of free-surface regions are formed where no first perturbation members exist in an arrangement of the first perturbation members, and wherein a plurality of second perturbation members are added to the free-surface regions at a second period different from the first period.

* * * * *

UNITED STATES PATENT AND TRADEMARK OFFICE
CERTIFICATE OF CORRECTION

PATENT NO.    : 6,359,368 B1
DATED         : March 19, 2002
INVENTOR(S)   : Jun Tsutsumi et al.

It is certified that error appears in the above-identified patent and that said Letters Patent is hereby corrected as shown below:

<u>Title page,</u>
Item [73], change "Fujitsu Limited, Kawasaki (JP)" to

-- Fujitsu Limited, Kawasaki (JP)
Fujitsu Media Devices Limited, Suzaka-shi (JP) --

Signed and Sealed this

First Day of April, 2003

JAMES E. ROGAN
*Director of the United States Patent and Trademark Office*